United States Patent
Lin et al.

(10) Patent No.: US 11,462,418 B2
(45) Date of Patent: Oct. 4, 2022

(54) INTEGRATED CIRCUIT PACKAGE AND METHOD

(71) Applicant: Taiwan Semiconductor Manufacturing Company, Ltd., Hsinchu (TW)

(72) Inventors: Shih Ting Lin, Taipei (TW); Szu-Wei Lu, Hsinchu (TW); Weiming Chris Chen, Taipei (TW); Kuo-Chiang Ting, Hsinchu (TW); Shang-Yun Hou, Jubei (TW); Chi-Hsi Wu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 131 days.

(21) Appl. No.: 16/745,610

(22) Filed: Jan. 17, 2020

(65) Prior Publication Data

US 2021/0225666 A1    Jul. 22, 2021

(51) Int. Cl.
| | |
|---|---|
| *H01L 21/48* | (2006.01) |
| *H01L 21/56* | (2006.01) |
| *H01L 23/00* | (2006.01) |
| *H01L 23/498* | (2006.01) |
| *H01L 23/14* | (2006.01) |
| *H01L 25/065* | (2006.01) |
| *H01L 21/768* | (2006.01) |
| *H01L 23/538* | (2006.01) |
| *H01L 23/31* | (2006.01) |

(52) U.S. Cl.
CPC ........ *H01L 21/563* (2013.01); *H01L 21/4853* (2013.01); *H01L 21/565* (2013.01); *H01L 21/768* (2013.01); *H01L 23/5389* (2013.01); *H01L 21/4857* (2013.01); *H01L 23/3128* (2013.01)

(58) Field of Classification Search
CPC combination set(s) only.
See application file for complete search history.

(56) References Cited

U.S. PATENT DOCUMENTS

| | | | |
|---|---|---|---|
| 8,987,922 B2 | 3/2015 | Yu et al. | |
| 8,993,380 B2 | 3/2015 | Hou et al. | |
| 9,000,584 B2 | 4/2015 | Lin et al. | |

(Continued)

FOREIGN PATENT DOCUMENTS

| | | |
|---|---|---|
| TW | 201415586 A | 4/2014 |
| TW | 201839931 A | 11/2018 |
| TW | 201935630 A | 9/2019 |

*Primary Examiner* — Mohsen Ahmadi
(74) *Attorney, Agent, or Firm* — Slater Matsil, LLP

(57) ABSTRACT

A method includes attaching semiconductor devices to an interposer structure, attaching the interposer structure to a first carrier substrate, attaching integrated passive devices to the first carrier substrate, forming an encapsulant over the semiconductor devices and the integrated passive devices, debonding the first carrier substrate, attaching the encapsulant and the semiconductor devices to a second carrier substrate, forming a first redistribution structure on the encapsulant, the interposer structure, and the integrated passive devices, wherein the first redistribution structure contacts the interposer structure and the integrated passive devices, and forming external connectors on the first redistribution structure.

20 Claims, 31 Drawing Sheets

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,899,305 B1 | 2/2018 | Yeh et al. |
| 10,522,470 B1 * | 12/2019 | Chang .................. H01L 24/20 |
| 11,081,372 B2 * | 8/2021 | Wu .................. H01L 25/0655 |
| 11,309,225 B2 * | 4/2022 | Tai .................. H01L 22/20 |
| 11,315,891 B2 * | 4/2022 | Tsai .................. H01L 25/0657 |
| 11,322,450 B2 * | 5/2022 | Hu .................. H01L 23/5389 |
| 2014/0103488 A1 | 4/2014 | Chen et al. |
| 2014/0124949 A1 * | 5/2014 | Paek .................. H01L 21/6835 438/126 |
| 2015/0048503 A1 * | 2/2015 | Chiu .................. H01L 23/49816 257/738 |
| 2016/0251353 A1 * | 9/2016 | Nti-Addae .................. C07D 403/04 514/255.06 |
| 2019/0006332 A1 * | 1/2019 | Hung .................. H01L 25/0657 |
| 2019/0148341 A1 * | 5/2019 | Liu .................. H01L 23/5384 257/678 |
| 2019/0164907 A1 * | 5/2019 | Chen .................. H01L 21/6835 |
| 2019/0244907 A1 | 8/2019 | Liao et al. |
| 2019/0244947 A1 | 8/2019 | Yu et al. |
| 2019/0304913 A1 * | 10/2019 | Wu .................. H01L 23/5385 |
| 2019/0393149 A1 * | 12/2019 | Wang .................. H01L 24/19 |
| 2020/0058626 A1 * | 2/2020 | Tai .................. H01L 21/568 |
| 2020/0135606 A1 * | 4/2020 | Pan .................. H01L 21/561 |
| 2020/0176387 A1 * | 6/2020 | Yu .................. H01L 21/4857 |
| 2020/0243450 A1 * | 7/2020 | Cho .................. H01L 23/49822 |
| 2020/0251353 A1 * | 8/2020 | Lu .................. H01L 23/3135 |
| 2020/0411488 A1 * | 12/2020 | Yu .................. H01L 25/18 |
| 2021/0057343 A1 * | 2/2021 | Chang .................. H01L 21/4853 |
| 2021/0391272 A1 * | 12/2021 | Tsai .................. H01L 25/0652 |

\* cited by examiner

INTEGRATED CIRCUIT PACKAGE AND METHOD

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
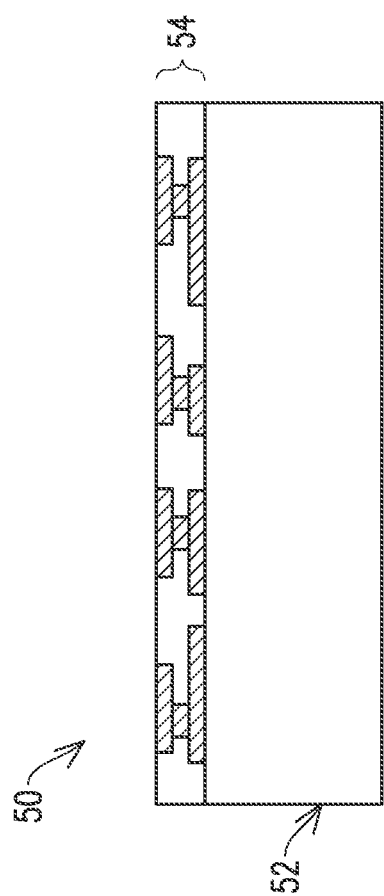
FIGS. 1-2 are cross-sectional views of intermediate steps during a process for forming device packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, packages containing integrated circuit devices are described. In some embodiments, a device structure containing multiple device packages that are electrically connected by a redistribution structure is described. The use of the redistribution structure may allow for smaller features to be formed within each device package, which can improve performance and lithographic patterning. In accordance with some embodiments, a package structure may be formed that includes electronic devices (e.g., surface-mount devices (SMDs)), device packages, and/or device structures. By using two separate carriers to form the package structure, electronic devices having different thicknesses may be used. Additionally a redistribution structure may be used to form electrical interconnections, which can reduce processing cost and the number of processing steps.

FIG. 1 is a cross-sectional view of an integrated circuit device 50, in accordance with some embodiments. The integrated circuit device 50 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit device 50 may be formed in a wafer, which may include different device regions that are singulated in subsequent steps to form a plurality of integrated circuit devices 50. The integrated circuit device 50 includes a substrate 52 and an interconnect structure 54.

The substrate 52 may include a bulk semiconductor substrate, semiconductor-on-insulator (SOI) substrate, multi-layered semiconductor substrate, or the like. The semiconductor material of the substrate 52 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 may be doped or undoped. Devices, such as transistors, capacitors, resistors, diodes, and the like, may be formed in and/or on an active surface (e.g., the surface facing upward) of the substrate 52.

An interconnect structure 54 having one or more dielectric layer(s) and respective metallization pattern(s) is formed on the active surface of the substrate 52. The dielectric layer(s) may be inter-metallization dielectric (IMD) layers. The IMD layers may be formed, for example, of a low-K dielectric material, such as undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spin coating, chemical vapor deposition (CVD), plasma-enhanced CVD (PECVD), high-density plasma chemical vapor deposition (HDP-CVD), or the like. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors such as conductive pillars or contact pads, are formed in and/or on the interconnect structure 54 to provide an external electrical connection to the circuitry and devices. One of ordinary skill in the art will appreciate that the above examples are provided for illustrative purposes. Other circuitry may be used as appropriate for a given application.

In some embodiments, the integrated circuit device 50 is a stacked device that includes multiple substrates 52. For example, the integrated circuit device 50 may be a memory device such as a hybrid memory cube (HMC) module, a high bandwidth memory (HBM) module, or the like, and may include multiple memory dies. In such embodiments, the integrated circuit device 50 includes multiple substrates 52 interconnected by vias. Each of the substrates 52 may (or may not) have a separate interconnect structure 54.

Figure 2:
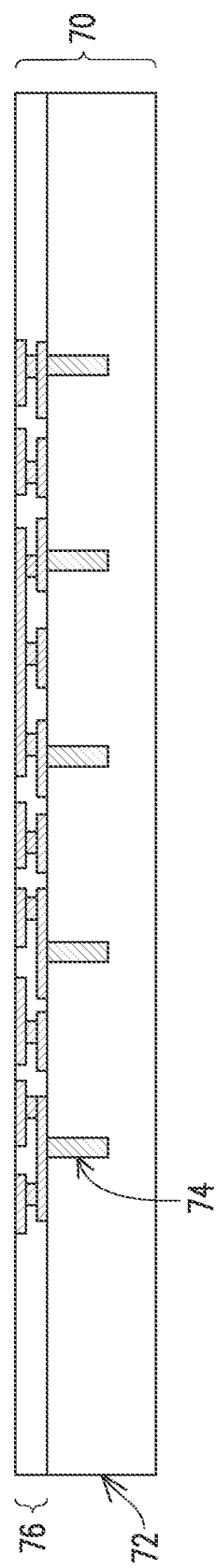

FIG. 2 is a cross-sectional view of an interposer 70, in accordance with some embodiments. Although only one interposer 70 is shown, it should be appreciated that the interposer 70 may be formed in a wafer having multiple device regions, with each device region used to form one interposer 70. The interposer 70 includes a substrate 72, through vias 74, and an interconnect structure 76.

The substrate 72 may be a bulk semiconductor substrate, SOI substrate, multi-layered semiconductor substrate, or the like. The semiconductor material of the substrate 72 may be silicon, germanium, a compound semiconductor including silicon germanium, silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, GaInAsP, combinations thereof, or the like. Other substrates, such as multi-layered or gradient substrates, may also be used. The substrate 72 may be doped or undoped. Devices, such as transistors, capacitors, resistors, diodes, and the like, may be formed in and/or on a surface of the substrate 72. The substrate 72 is, in some embodiments, based on an insulating core such as a fiberglass reinforced resin core. For example, the core material may be fiberglass resin such as FR4, bismaleimide-triazine (BT) resin, other printed circuit board (PCB) materials or films, a combination, or the like. Build up films such as Ajinomoto build-up film (ABF) or other laminates may be used for the substrate 72.

The through vias 74 are formed to extend from the front surface of the substrate 72 into substrate 72. The through vias 74 are also sometimes referred to as through-substrate vias or through-silicon vias (TSVs) when the substrate 72 is a silicon substrate. The through vias 74 may be formed by forming recesses in the substrate 72 by, for example, etching, milling, laser techniques, a combination thereof, or the like. A thin dielectric material may be formed in the recesses, such as by using an oxidation technique. A thin barrier layer may be conformally deposited over the front side of the substrate 72 and in the openings, such as by CVD, atomic layer deposition (ALD), physical vapor deposition (PVD), thermal oxidation, combinations thereof, and/or the like. The barrier layer may be formed from a nitride or an oxynitride, such as titanium nitride, titanium oxynitride, tantalum nitride, tantalum oxynitride, tungsten nitride, combinations thereof, or the like. A conductive material may be deposited over the thin barrier layer and in the openings. The conductive material may be formed by an electro-chemical plating process, CVD, ALD, PVD, combinations thereof, or the like. Examples of conductive materials are copper, tungsten, aluminum, silver, gold, combinations thereof, or the like. Excess conductive material and barrier layer may be removed from the front side of the substrate 72 by, for example, a chemical-mechanical polish (CMP). Thus, the through vias 74 may include a conductive material, with a thin barrier layer between the conductive material and the substrate 72.

The interconnect structure 76 is formed over the front surface of the substrate 72, and is used to form electrical connections between the devices of the substrate 72 (if any), the through vias 74, and/or external devices. The interconnect structure 76 may include one or more dielectric layers and respective metallization patterns in the dielectric layers. The metallization patterns may be Redistribution Layers (RDLs) that include vias and/or traces that form the electrical connections. In some embodiments, the interconnect structure 76 may be a redistribution structure or a fan-out structure.

In some embodiments, the interconnect structure 76 is formed by forming a first dielectric layer (not individually labeled in FIG. 2) on the substrate 72. In some embodiments, the first dielectric layer is formed of a polymer, which may be a photo-sensitive material such as polybenzoxazole (PBO), polyimide, benzocyclobutene (BCB), or the like, that may be patterned using lithography. In other embodiments, the first dielectric layer is formed of a nitride such as silicon nitride, an oxide such as silicon oxide, Phosphosilicate Glass (PSG), Borosilicate Glass (BSG), Boron-doped Phosphosilicate Glass (BPSG), or the like. The first dielectric layer may be formed by spin coating, lamination, CVD, the like, or a combination thereof. The first dielectric layer is then patterned to form openings that expose the through vias 74. In embodiments in which the first dielectric layer is formed of a photo-sensitive material, the patterning may be performed by exposing the first dielectric layer in accordance with a desired pattern and performing a developing process to remove the unwanted material, thereby exposing the through vias 74. Other techniques, such as using a patterned mask and etching, may also be used to pattern the first dielectric layer.

A seed layer (not shown in FIG. 2) is formed over the first dielectric layer and in the openings formed in the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A mask (not shown in FIG. 2) is then formed and patterned on the seed layer in accordance with a desired metallization pattern. In some embodiments, the mask is a photoresist formed by spin coating or the like, which is then exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, such as copper, titanium, tungsten, aluminum, a combination of these, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form a first RDL within the interconnect structure 76.

Additional dielectric layers and additional RDLs may then be formed over the first dielectric layer to form additional electrical connections within the interconnect structure 76. The additional dielectric layers and additional RDLs may be formed using similar materials and processes as used to form the first dielectric layer and first RDL. For example, additional dielectric layers may be formed in a process and with materials similar to the first dielectric layer. Openings may be made through each of the additional dielectric layers to expose at least a portion of an underlying RDL. The openings may be formed using a suitable photolithographic mask and etching process, such as those described above for the first dielectric layer, although any suitable process may alternatively be used. In some embodiments, the additional dielectric layers are formed of a photosensitive polymer, and openings may be patterned directly in the additional dielectric layers using a photolithographic mask and etching process.

The additional RDLs may be formed in each additional dielectric layer to provide additional electrical connection within the interconnect structure 76. In an embodiment, the additional RDLs may be formed using materials and processes similar to the first RDL. For example, a seed layer may be formed, and a photoresist placed and patterned on top of the seed layer in a desired pattern for an additional RDL. Conductive material may then be formed in the patterned openings of the photoresist using e.g., a plating process. The photoresist may then be removed and the seed layer etched, forming the additional RDL. The interconnect structure 76 may be formed in this manner from multiple dielectric layers and multiple RDLs.

In some embodiments, under bump metallization (UBMs) may be formed and patterned over an uppermost RDL of the interconnect structures 76. The UBMs provide electrical connections to the interconnect structures 76 upon which an electrical connector, e.g., a solder ball/bump, a conductive pillar, or the like, may be placed. In some embodiments, the UBMs include a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. The UBMs may be formed using sputtering, electroplating, or the like.

FIGS. 3A through 15 are cross-section views of intermediate steps during a process for forming stacked semiconductor devices, in accordance with some embodiments. In FIGS. 3A through 9, a device package 100 is formed by bonding various integrated circuit devices 50 to the front side of the interposer 70. In some embodiments, the first device package 100 is a chip-on-wafer (CoW) package, although it should be appreciated that embodiments may be applied to other three-dimensional integrated circuit (3DIC) packages. A device structure 100 may be used in the formation of a package structure such as package structures 200 (see FIG. 22) or package structure 300 (see FIG. 28).

Figure 3A:
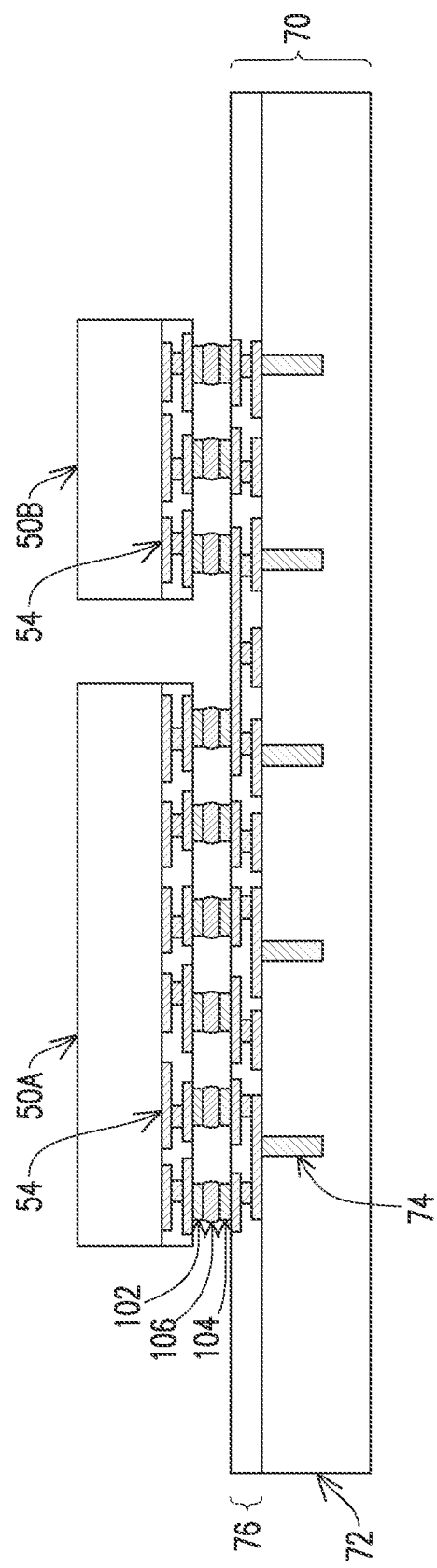
FIGS. 3A-C are cross-sectional views and plan views of intermediate steps during a process for forming device packages, in accordance with some embodiments.
Figure 3B:
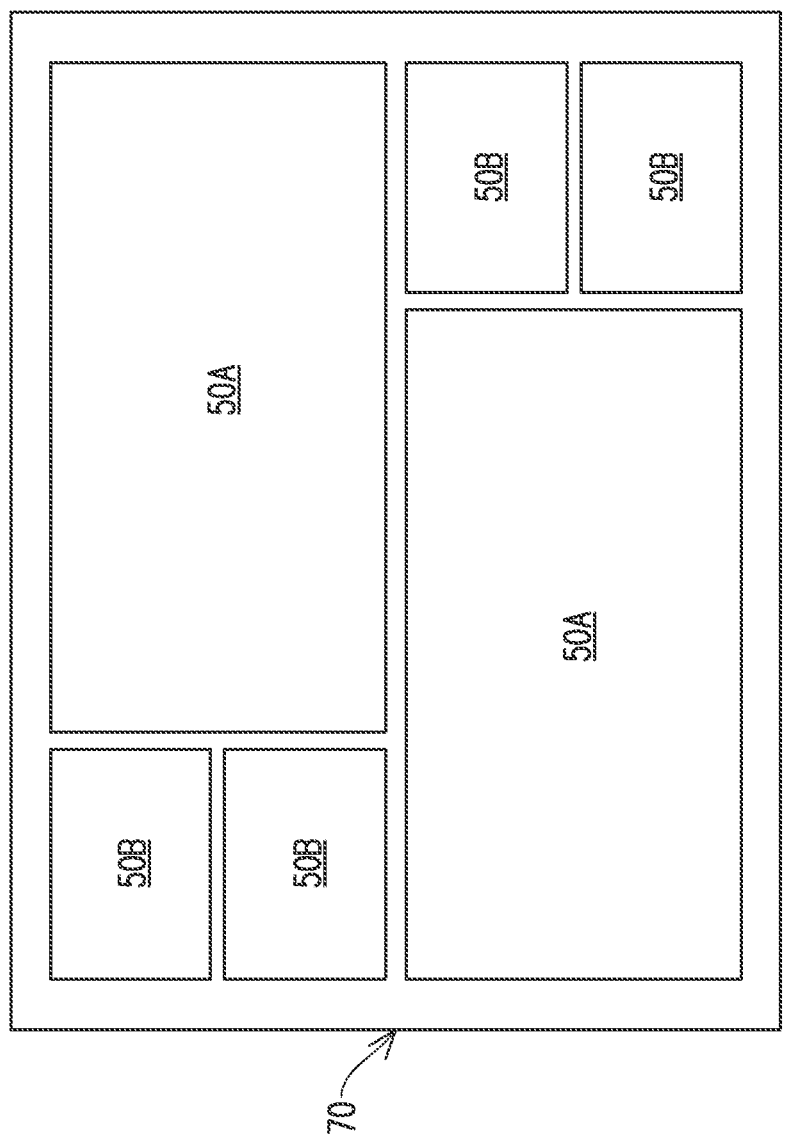
Figure 3C:
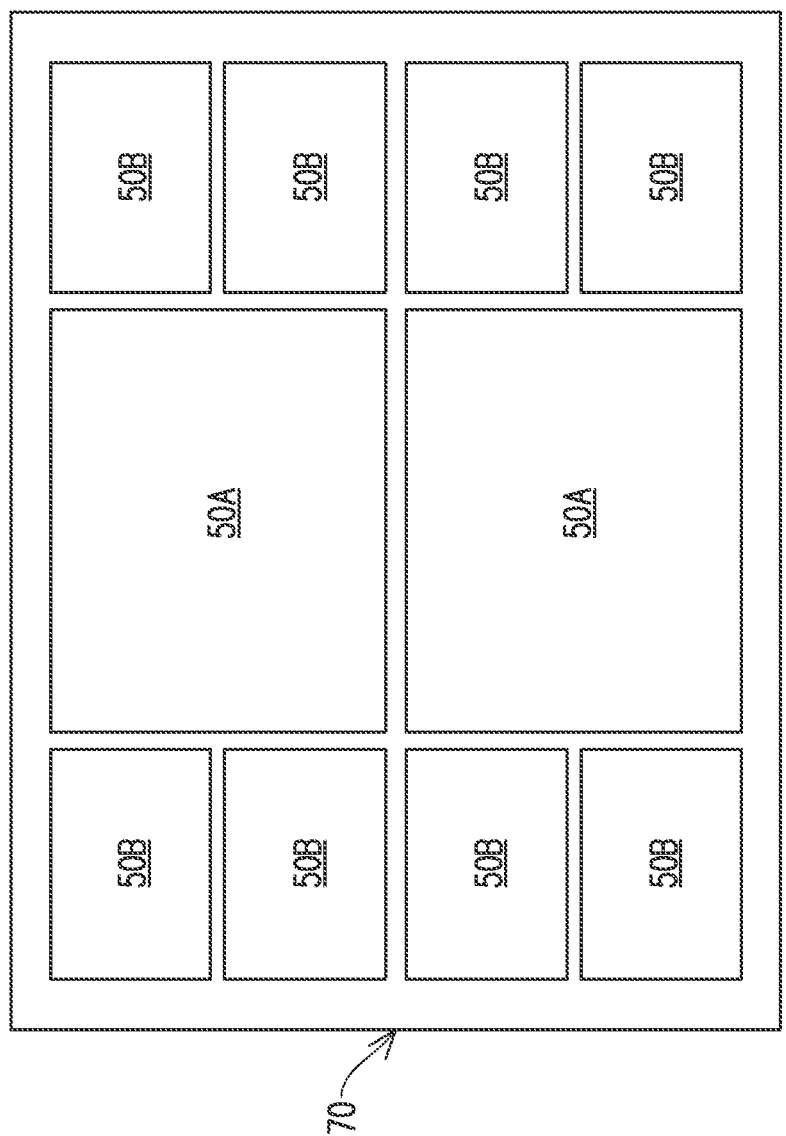

In FIGS. 3A-C, one or more integrated circuit devices 50 are attached to the interposer 70. FIG. 3A shows a cross-sectional view of integrated circuit devices 50A and 50B attached to an interposer 70, and FIGS. 3B-C show plan views of integrated circuit devices 50A and 50B attached to the interposer 70 in different arrangements, in accordance with some embodiments. The interconnect structures 54 and 76 physically and electrically connect the integrated circuit devices 50 and the interposer 70. The integrated circuit devices 50 may be electrically connected to each other through the interconnect structure 76. The integrated circuit devices 50 may include similar devices and/or different devices. For example, the embodiments shown in FIGS. 3A-C include integrated circuit devices 50A and integrated circuit devices 50B, in which the devices 50A may have different functions than the devices 50B. The integrated circuit devices 50A or 50B may each have a single function (e.g., a logic device, a memory die, etc.), or may have multiple functions (e.g., a system-on-chip or the like). In an embodiment, the integrated circuit devices 50A are logic devices such as CPUs and the integrated circuit devices 50B are memory devices such as HBM modules. In some embodiments, an integrated circuit device 50 may be associated with other integrated circuit devices 50. For example, a single device 50A may have one or more device 50B associated with it and which are electrically connected to that device 50A (e.g., through the interconnect structure 76).

The integrated circuit devices 50A and 50B may be attached to the interconnect structure 76 using, for example, a pick-and-place tool. In embodiments in which the interposer 70 is formed in a wafer, the integrated circuit devices 50 may be attached in different device regions of the wafer. The different device regions may then be singulated in subsequent steps to form multiple first device packages 100 (see FIG. 9). The integrated circuit devices 50 may be arranged on the interconnect structure 76 or within a device region in any suitable configuration. For example, FIG. 3B shows devices 50A with devices 50B adjacent one side of each device 50A, and FIG. 3C shows devices 50A with devices 50B adjacent opposite sides of each device 50A. In some embodiments, such as the embodiment of FIG. 3B, the integrated circuit devices 50B are asymmetrically laid out adjacent the integrated circuit devices 50A. In some embodiments, such as the embodiment of FIG. 3C, the integrated circuit devices 50B are symmetrically laid out adjacent the integrated circuit devices 50A. An asymmetric layout may allow the integrated circuit devices 50B to be located closer to input/output (I/O) connecting regions of the integrated circuit devices 50A. These are examples, and other configurations or arrangements are possible.

In the embodiment shown in FIG. 3A, the integrated circuit devices 50A and 50B are attached to the interconnect structure 76 with connections that include conductive bumps 102, conductive bumps 104, and conductive connectors 106. The conductive bumps 102 are electrically and physically connected to the interconnect structure 54, and the conductive bumps 104 are electrically and physically connected to the interconnect structure 76. The conductive connectors 106 bond the conductive bumps 102 and 104. The conductive bumps 102 may be formed over UBMs (if present) of the interconnect structure 54 or the interconnect structure 76. The conductive bumps 102 or 104 may be formed from a conductive material such as copper, aluminum, gold, nickel, palladium, the like, or combinations thereof. The conductive bumps 102 or 104 may be formed by a suitable process such as sputtering, printing, electro plating, electroless plating, CVD, or the like. In some embodiments, the conductive bumps 102 or 104 may also comprise metal pillars (such as copper pillars) formed by sputtering, printing, electroplating, electroless plating, CVD, or the like. The metal pillars may be solder free and have substantially vertical sidewalls or tapered sidewalls. The conductive bumps may also be referred to as microbumps.

The conductive connectors 106 may be formed from a conductive material such as solder, and may be formed by initially forming a layer of solder on the conductive bumps 102 or 104 through methods such as evaporation, electroplating, printing, solder transfer, ball placement, or the like. Once the layer of solder has been formed, a reflow process may be performed in order to shape the conductive connectors 106 into desired bump shapes.

In other embodiments, the integrated circuit devices 50 are attached to the interconnect structure 76 by face-to-face bonds. For example, hybrid bonding, fusion bonding, direct bonding, dielectric bonding, metal bonding, or the like may be used to attach the interconnect structures 54 and 76 without the use of solder. Further, a mix of bonding techniques could be used, e.g., some of the integrated circuit devices 50A and 50B could be bonded to the interconnect structure 76 by conductive connectors 106, and other integrated circuit devices 50A and 50B could be bonded to the interconnect structure 76 by face-to-face bonds.

Figure 4:
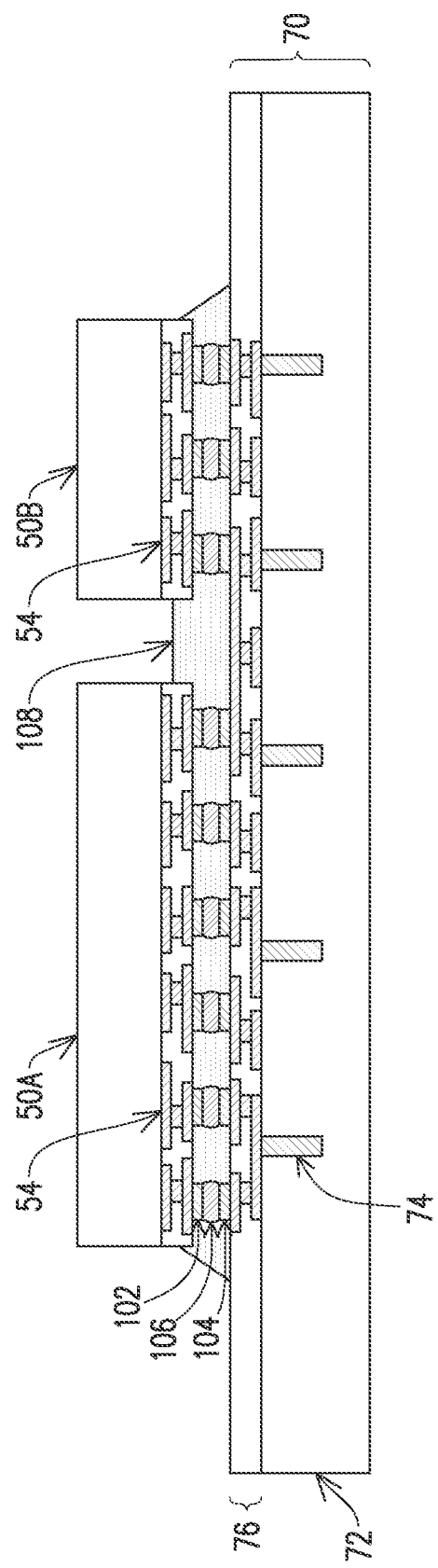
FIGS. 4-9 are cross-sectional views of intermediate steps during a process for forming device packages, in accordance with some embodiments.

In FIG. 4, an underfill material 108 is dispensed between the integrated circuit devices 50 and the interconnect structure 76. The underfill material 108 surrounds the conductive bumps 102 and 104 and the conductive connectors 106. The underfill material 108 may be any acceptable material, such as a polymer, epoxy, molding underfill, or the like. The underfill material 108 may be formed by a capillary flow process.

Figure 5:
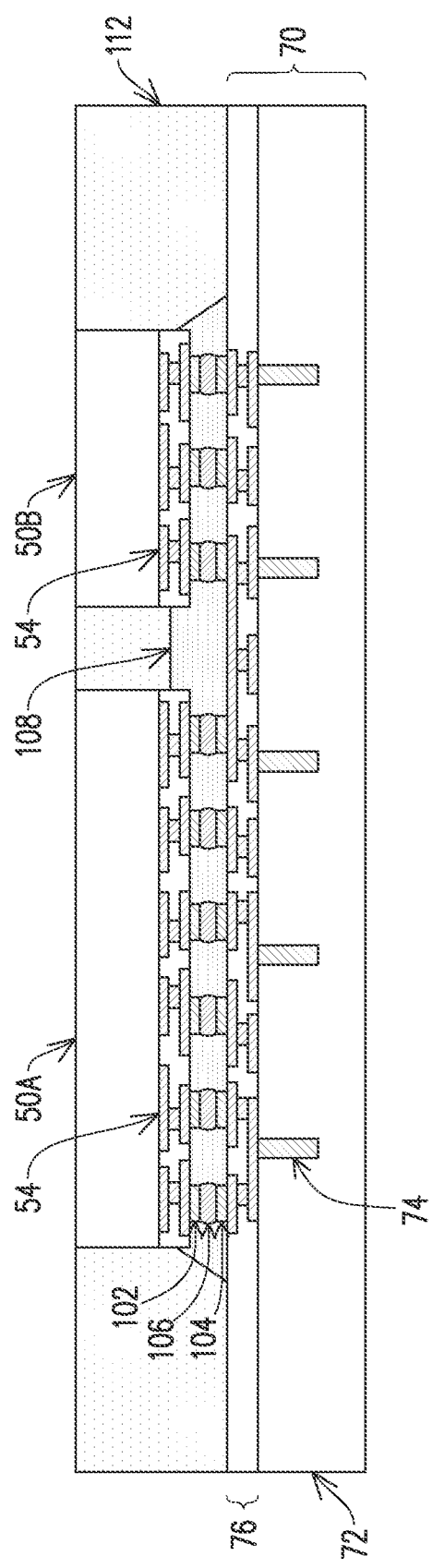

In FIG. 5, an encapsulant 112 is formed on the various components of the structure. The encapsulant 112 may be a molding compound, epoxy, or the like, and may be applied by compression molding, transfer molding, or the like. The encapsulant 112 may be formed over the interconnect structure 76 such that the integrated circuit devices 50 and the underfill material 108 are surrounded and covered by the encapsulant 112. The encapsulant 112 may then be cured. In some embodiments, excess material of the encapsulant 112 is removed (e.g., by CMP), which may also planarize the structure such that top surfaces of the encapsulant 112 and top surfaces of the integrated circuit devices 50 are level.

Figure 6:
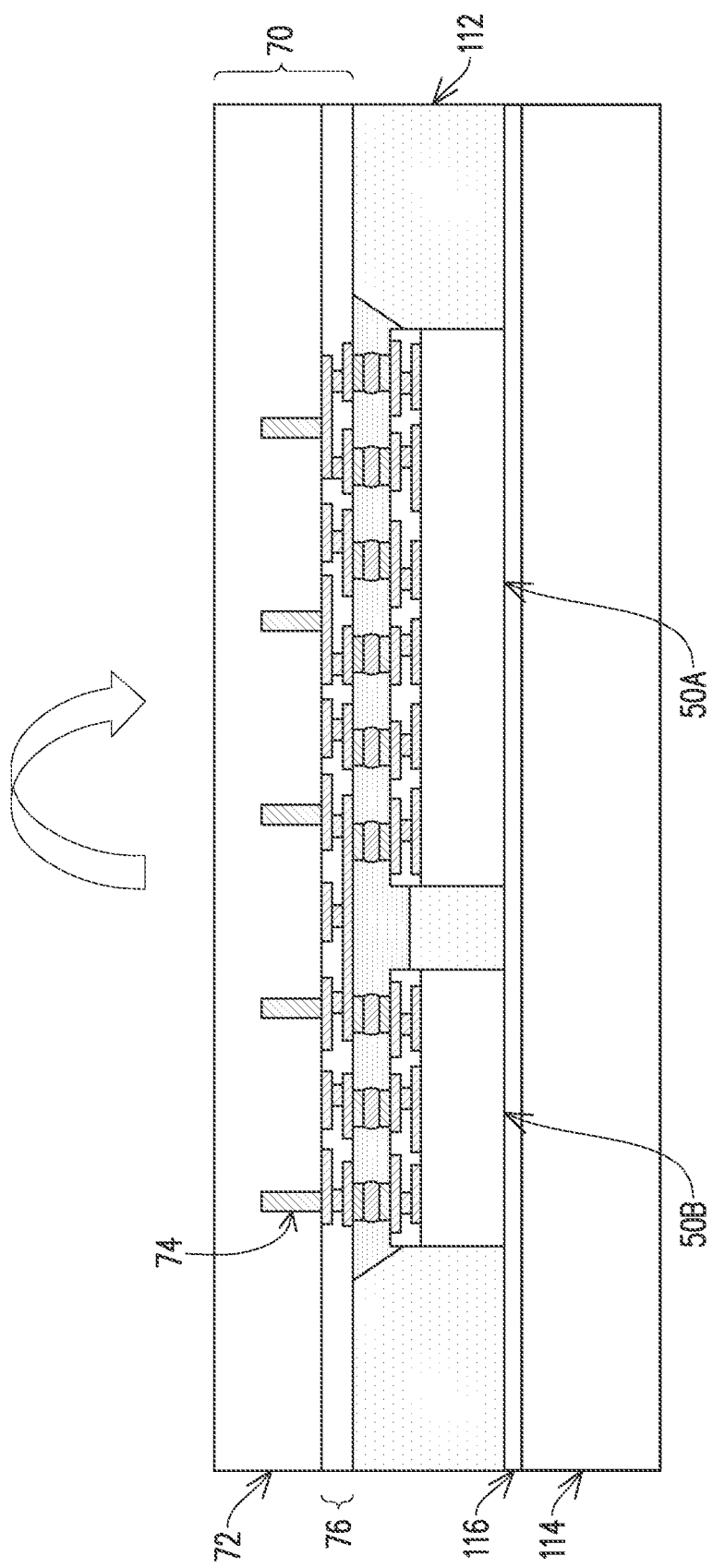

In FIG. 6, the structure is flipped over and attached to a carrier 114 or other suitable support structure for subsequent processing. The carrier 114 may be a glass carrier substrate, a ceramic carrier substrate, or the like. The carrier 114 may be a wafer, such that multiple packages can be formed on the carrier 114 simultaneously. The structure may be attached to the carrier 114, for example, by a release layer 116. The release layer 116 may be formed of a polymer-based material, which may be removed along with the carrier 114 from the overlying structures that will be formed in subsequent steps. In some embodiments, the release layer 116 is an epoxy-based thermal-release material, which loses its adhesive property when heated, such as a light-to-heat-conversion (LTHC) release coating. In other embodiments, the release layer 116 may be an ultra-violet (UV) glue, which loses its adhesive property when exposed to UV lights. The release layer 116 may be dispensed as a liquid and cured, may be a laminate film laminated onto the carrier 114, or may be the like. The top surface of the release layer 116 may be leveled and may have a high degree of coplanarity.

Figure 7:
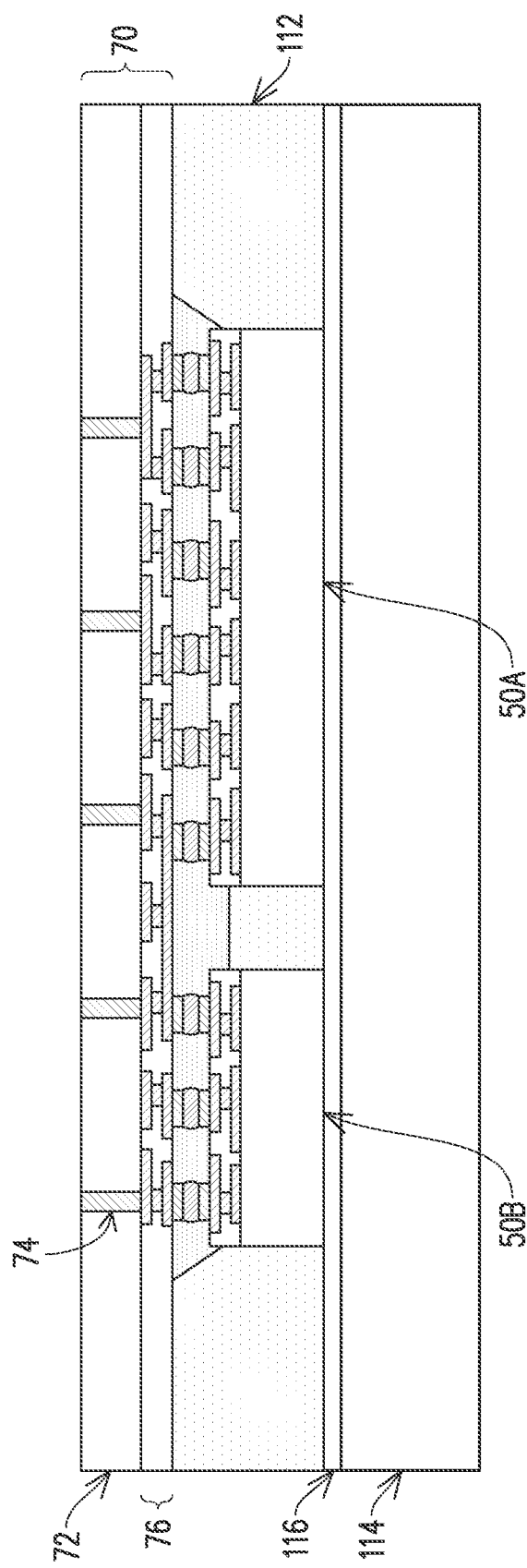

In FIG. 7, the substrate 72 is thinned (e.g., by CMP) to expose the through vias 74. In some embodiments, exposed surfaces of the substrate 72 and exposed surfaces of the through vias 74 are level. In some embodiments (not shown), a recessing process may be performed to recess the substrate 72 such that the through vias 74 protrude from the back side of the substrate 72. The recessing process may be, e.g., a suitable etch-back process using a wet etch and/or a dry etch. In some embodiments, an insulating layer (not shown) may be formed on the back side of the substrate 72, surrounding and protecting the protruding portions of the through vias 74.

Figure 8:
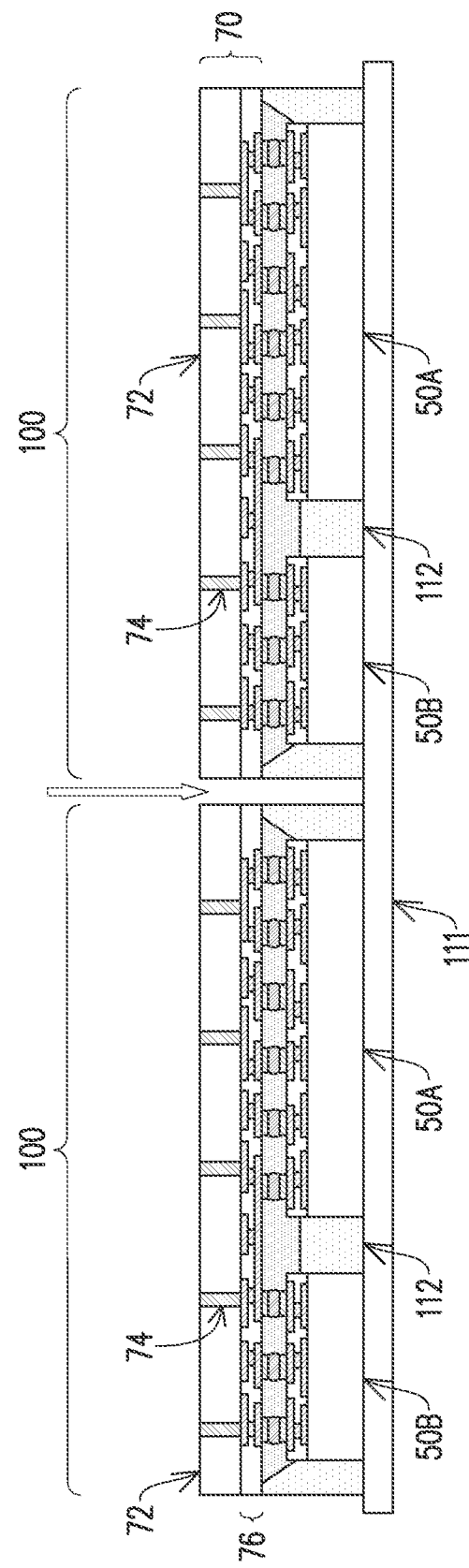
Figure 9:
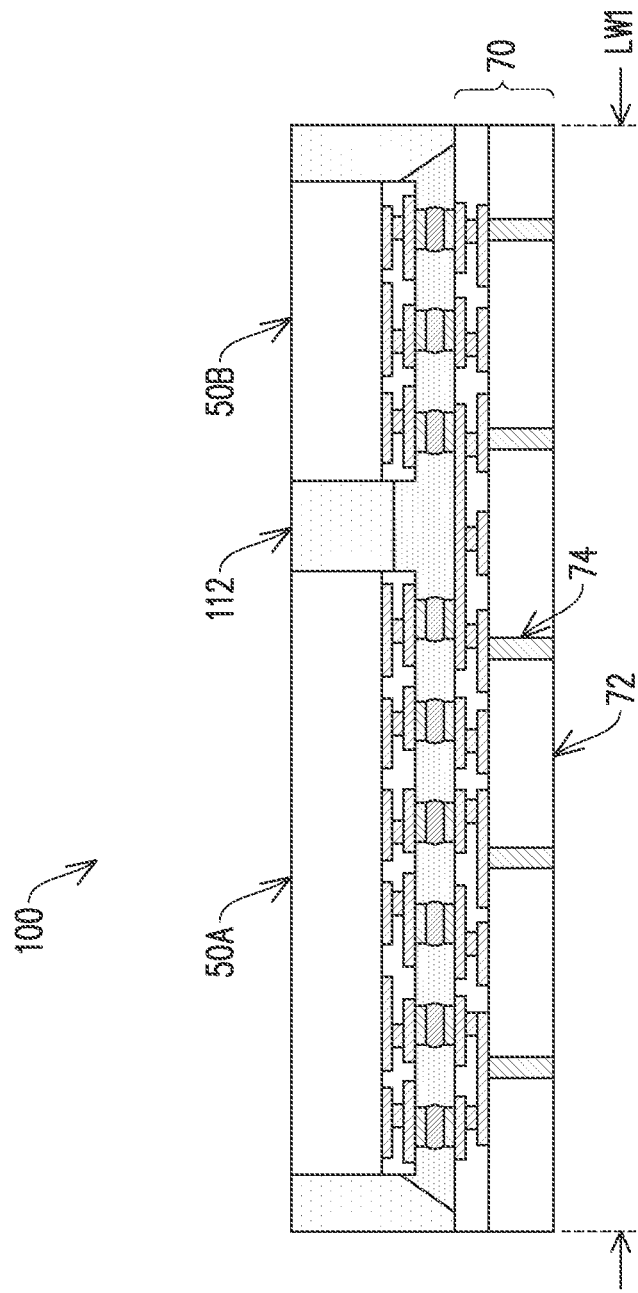

In FIG. 8, the structure is debonded from the carrier 114 and singulated, forming one or more device packages 100. In accordance with some embodiments, the debonding includes projecting a light such as a laser light or an ultraviolet (UV) light on the release layer 116 so that the release layer 116 decomposes under the heat of the light and the carrier 114 can be removed. Other techniques of removing the release layer 116 or the carrier 114 may be used in other embodiments. The structure may then placed on a tape 111 or the like, and then singulated to form individual device packages 100, as shown in FIG. 8. For example, the interposer 70 may be singulated along scribe line regions between adjacent device regions to form the device packages 100. The singulation process may include sawing, dicing, or the like. After singulation, the sidewalls of the interposer 70 and the sidewalls of the encapsulant 112 of each device package 100 may be coplanar. An individual device package 100 is shown in FIG. 9. In some embodiments, individual device packages 100 may have a length or a width (e.g., LW1 shown in FIG. 9) that is between about 20 mm and about 50 mm. The device package 100 may also be referred to as a Chip-on-Wafer (CoW) device.

FIGS. 10 through 16 are cross-section views and plan views of intermediate steps during a process for forming device structures 110 (see FIG. 12), in accordance with some embodiments. Each device structure 110 includes multiple device packages 100 that are electrically connected to each other by a redistribution structure 120. Similar to the device packages 100 described above, a device structure 110 may be used in the formation of a package structure such as package structure 300 (see FIG. 28). In some embodiments of a device structure 110, rather than using a single large interposer 70 for a single set of integrated circuit devices 50 (as in device packages 100), multiple sets of integrated circuit devices 50 are formed on separate, smaller interposers 70 which are electrically interconnected by a redistribution structure 120. In some cases, forming smaller interposers 70 in this manner allows the use of reticles configured for larger pattern reduction (e.g., reduction of 2×, 3×, 4×, or greater) during photolithographic patterning of the interconnect structure 76. The use of larger pattern reduction can allow for smaller patterned feature size such as a greater density of RDLs, a smaller linewidth of RDLs, or the like. The larger pattern reduction may also allow for reduced line roughness of patterned features and a reduced chance of process defects during patterning. Additionally, the smaller feature size of the interconnect structure 76 may allow for less noisy and more efficient transmission of electrical signals, particularly for signals at higher frequencies (e.g., greater than about 2 MHz, such as about 5 MHz). Thus, by forming a device structure 110 having multiple integrated circuit devices 50 attached to multiple interposers 70, electrical interconnects between integrated the semiconductor devices 50 on each interposer 70 may be formed having smaller features sizes and with improved process reliability. In some embodiments, the functionality of a single integrated circuit device (e.g. device 50A in FIG. 9) may be separated into two or more integrated circuit devices (e.g., devices 50C and 50D in FIGS. 15-16), which are each attached to a separate interposer 70.

Figure 10:
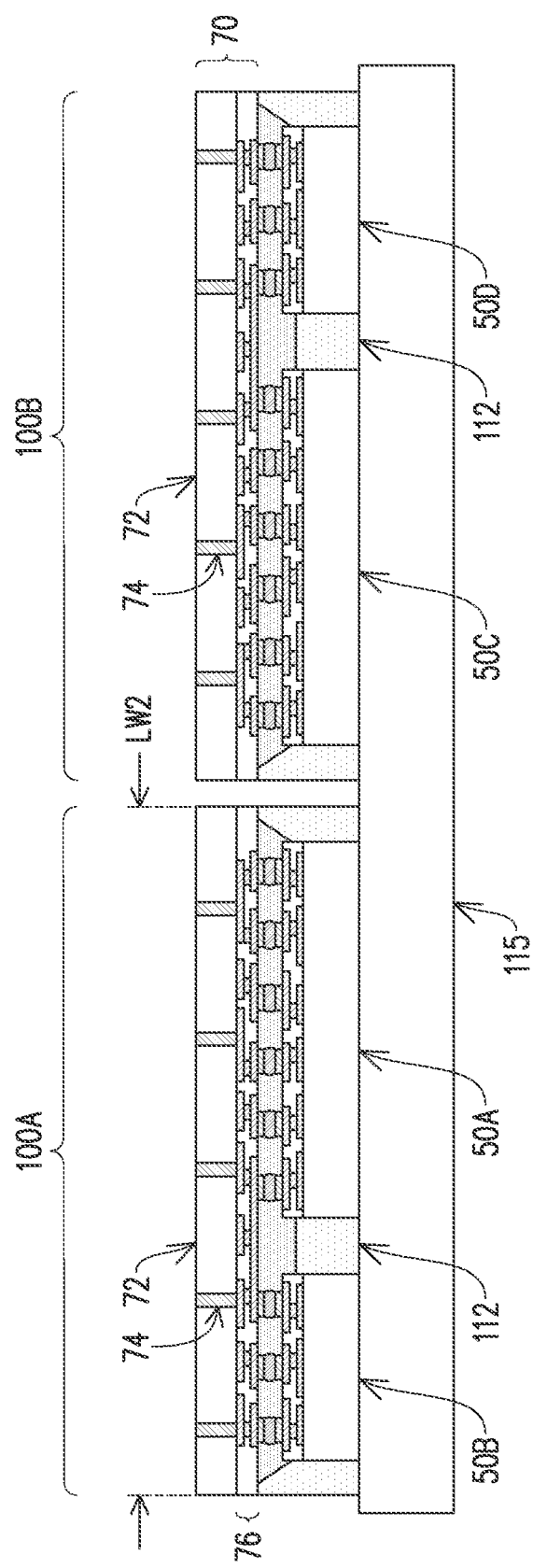
FIGS. 10-13 are cross-sectional views of intermediate steps during a process for forming device structures, in accordance with some embodiments.

Turning to FIG. 10, multiple device packages 100 are attached to a carrier 115, in accordance with some embodiments. The carrier 115 may be, for example, a carrier or a material as described previously for the carrier 114 (see FIG. 6). FIG. 10 shows two device packages 100 (designated 100A and 100B) attached to the carrier 115, but in other embodiments, more than two device packages 100 may be attached to the carrier, and the device packages 100 may be attached in any suitable configuration or arrangement. The embodiment shown in FIG. 10 includes a first device package 100A that includes integrated circuit devices 50A and 50B and a second device package 100B that includes integrated circuit devices 50C and 50D. The integrated circuit devices 50 within each device package may be similar or different. For example, the integrated circuit device 50A in device package 100A may be similar to or different from the integrated circuit device 50C in device package 100B, or the integrated circuit devices 50B in device package 100A may be similar to or different from the integrated circuit devices 50D in device package 100B. Any combinations of similar or different integrated circuit devices 50 may be present in the device packages 100, and other configurations of integrated circuit devices 50 are possible.

The device packages 100 may be attached to the interconnect structure 76 using, for example, a pick-and-place tool. In some embodiments, an adhesive layer (not shown in FIG. 10) may be formed on the carrier 115 or on the device packages 100 to facilitate attachment. In some embodiments, individual device packages 100 may have a length or a width (e.g., LW2 shown in FIG. 10) that is between about 20 mm and about 50 mm. In some embodiments, the device packages 100 may undergo electrical testing before placement on the carrier 115. In this manner, only known good device packages 100 may be attached, improving the yield of the subsequently formed device structure 110 or package structure 300.

Figure 11:
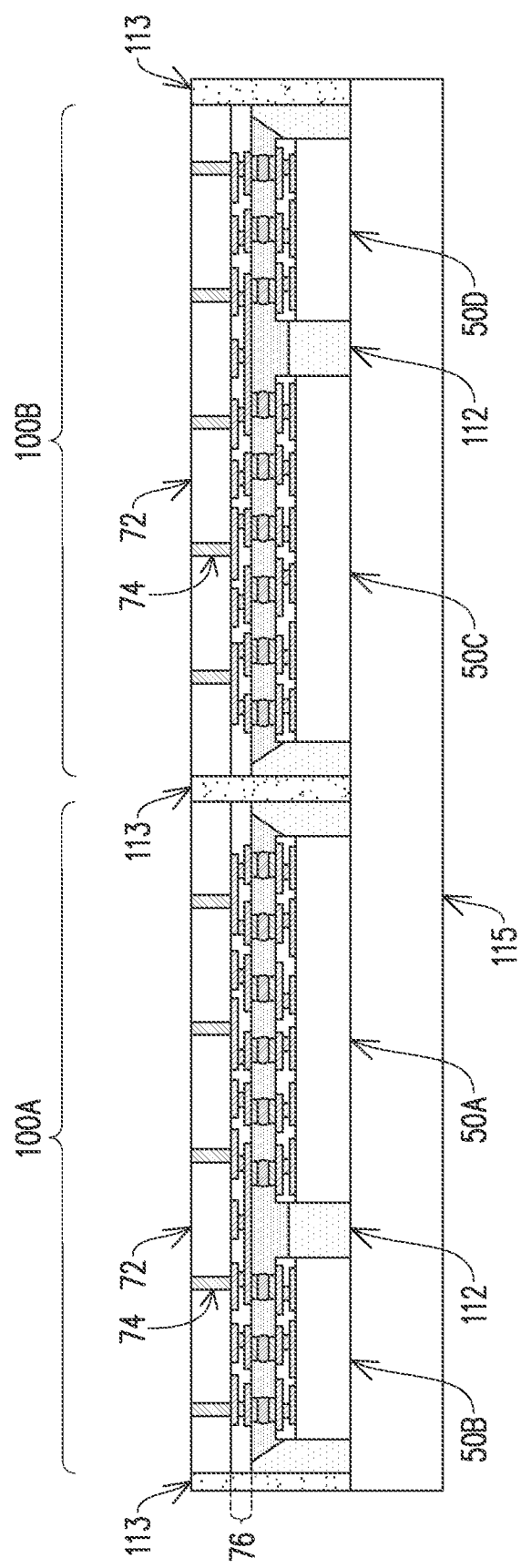

In FIG. 11, an encapsulant 113 is formed on the device packages 100 and the carrier 115, in accordance with some embodiments. The encapsulant 113 may be a molding compound, epoxy, or the like, and may be applied by compression molding, transfer molding, or the like. The encapsulant 113 may be similar to the encapsulant 112 (see FIG. 5), in some embodiments. The encapsulant 113 may be formed such that the device packages 100 are surrounded and covered by the encapsulant 113. The encapsulant 113 may then be cured. In some embodiments, excess material of the encapsulant 113 is removed (e.g., by CMP), which may also planarize the structure such that top surfaces of the encapsulant 113 and top surfaces of the device packages 100 are level.

Figure 12:
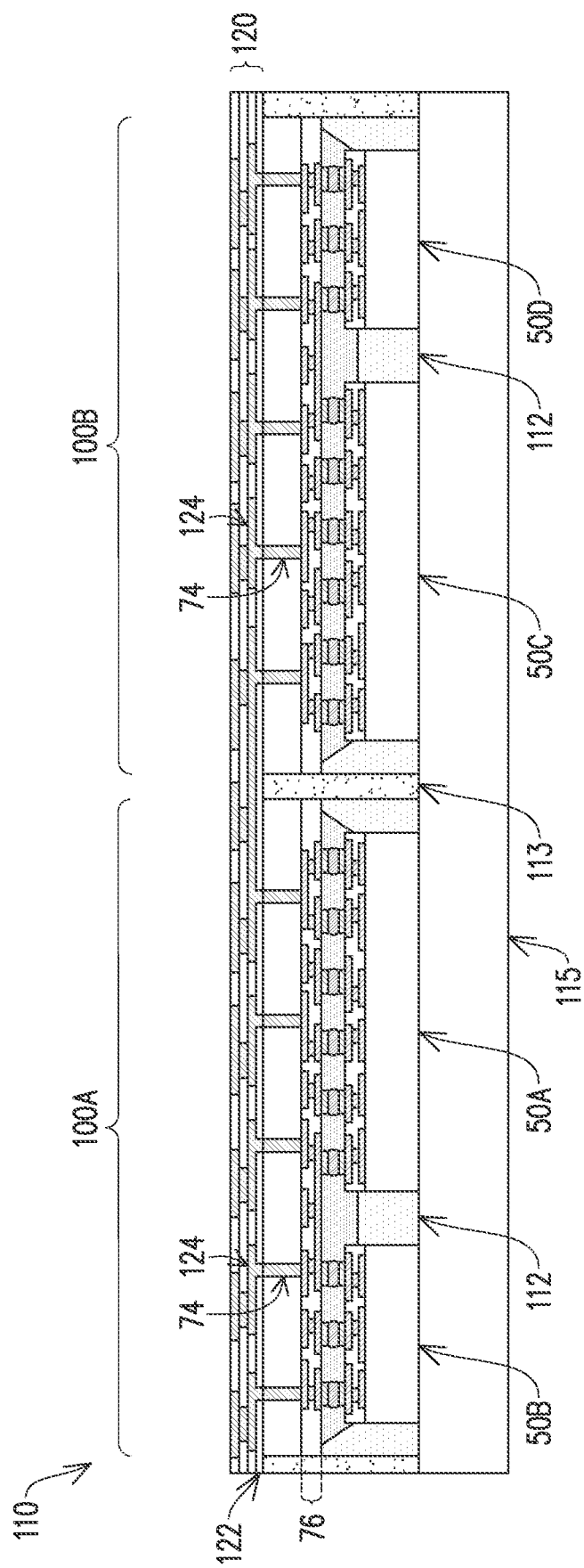

The redistribution structure 120 is formed over the device packages 100, and is used to form electrical connections between the device packages 100 and/or external devices. The redistribution structure 120 may include one or more dielectric layers and RDLs that include vias and/or traces that form the electrical connections. The redistribution structure 120 shown in FIG. 12 is an illustrative example, and more or fewer dielectric layers and/or RDLs may be formed in the redistribution structure 120.

In some embodiments, the redistribution structure 120 is formed in a manner similar to that of the interconnect structure 76 (see FIG. 2). For example, the redistribution structure 120 may be formed by first forming a dielectric layer 122 over the device packages 100 and the encapsulant 113. In some embodiments, the dielectric layer 122 is formed of a polymer, which may be a photo-sensitive material such as PBO, polyimide, BCB, or the like, that may be patterned using lithographic techniques. The dielectric layer 122 may be formed by spin coating, lamination, CVD, the like, or a combination thereof. The dielectric layer 122 is then patterned to form openings that expose the through vias 74 of the device structures 100. The patterning may be performed by, for example, exposing the dielectric layer 122 in accordance with a desired pattern and performing a developing process to remove the unwanted material, thereby exposing the through vias 74. Other techniques, such as using a patterned mask and etching, may also be used to pattern the dielectric layer 122.

A seed layer (not shown in FIG. 12) is formed over the dielectric layer 122 and in the openings formed in the dielectric layer 122. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A mask (not shown in FIG. 12) is then formed and patterned on the seed layer. In some embodiments, the mask is a photoresist formed by spin coating or the like, which is then exposed to light for patterning. The patterning forms openings through the mask to expose the seed layer. A conductive material is then formed in the openings of the mask and on the exposed portions of the seed layer. The conductive material may be formed by plating, such as electroplating or electroless plating, or the like. The conductive material may comprise a metal, such as copper, titanium, tungsten, aluminum, a combination of these, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form a RDL 124 within the redistribution structure 120.

Additional dielectric layers and additional RDLs may then be formed over the dielectric layer 122 and RDL 124 to form additional electrical connections within the redistribution structure 120. The additional dielectric layers and additional RDLs may be formed using similar materials and processes as used to form the dielectric layer 122 and/or RDL 124. For example, additional dielectric layers may be formed in a process and with materials similar to the dielectric layer 122. Openings may be made through each of the additional dielectric layers to expose at least a portion of an underlying RDL. The openings may be formed using a suitable photolithographic mask and etching process, such as those described above for the dielectric layer 122, although any suitable process may alternatively be used. In some embodiments, the additional dielectric layers are formed of a photosensitive polymer, and openings may be patterned directly in the additional dielectric layers using a photolithographic mask and etching process.

The additional RDLs may be formed in each additional dielectric layer to provide additional electrical connection within the redistribution structure 120. In an embodiment, the additional RDLs may be formed using materials and processes similar to the RDL 124. For example, a seed layer may be formed, and a photoresist placed and patterned on top of the seed layer in a desired pattern for an additional RDL. Conductive material may then be formed in the patterned openings of the photoresist using e.g., a plating process. The photoresist may then be removed and the seed layer etched, forming the additional RDL. The redistribution structure 120 may be formed in this manner from multiple dielectric layers and multiple RDLs.

Figure 13:
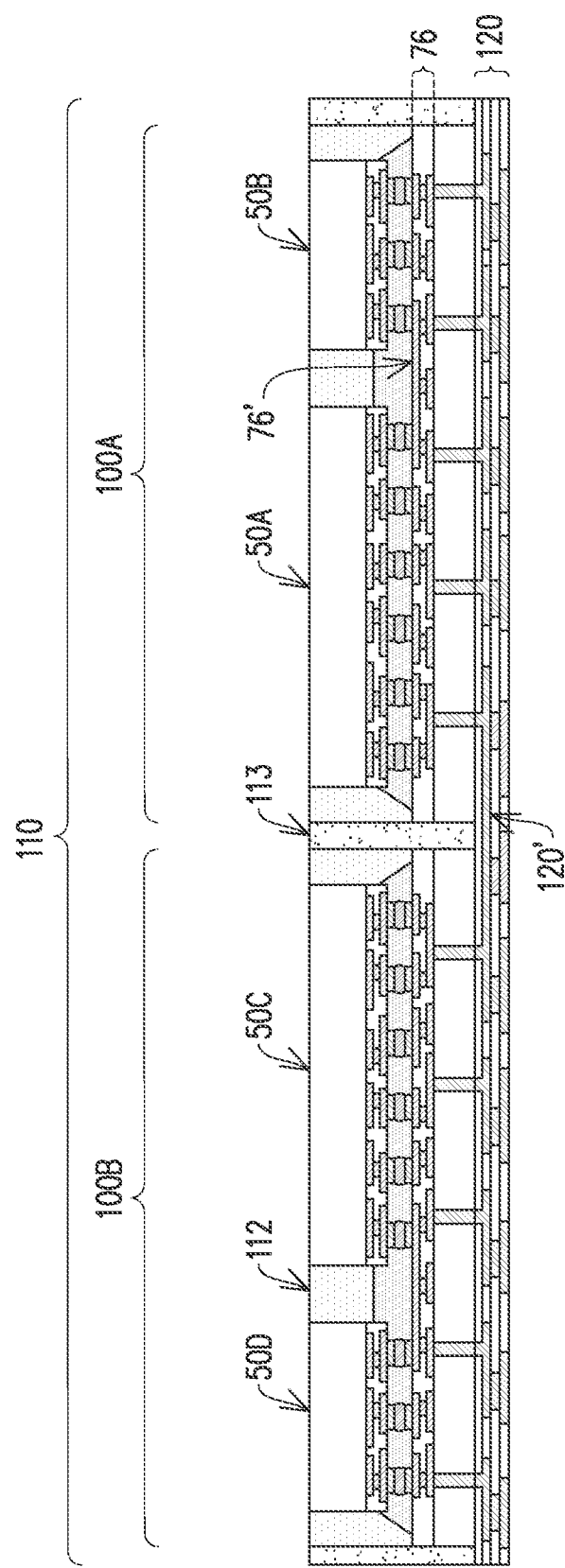

Turning to FIG. 13, the carrier 115 is debonded from the structure, forming a device structure 110. In some embodiments, the device structure 110 may also be singulated using e.g., a sawing or dicing process. As a result of the singulation process, the outer sidewalls of the redistribution structure 120 and the outer sidewalls of the encapsulant 113 may be coplanar.

Figure 14:
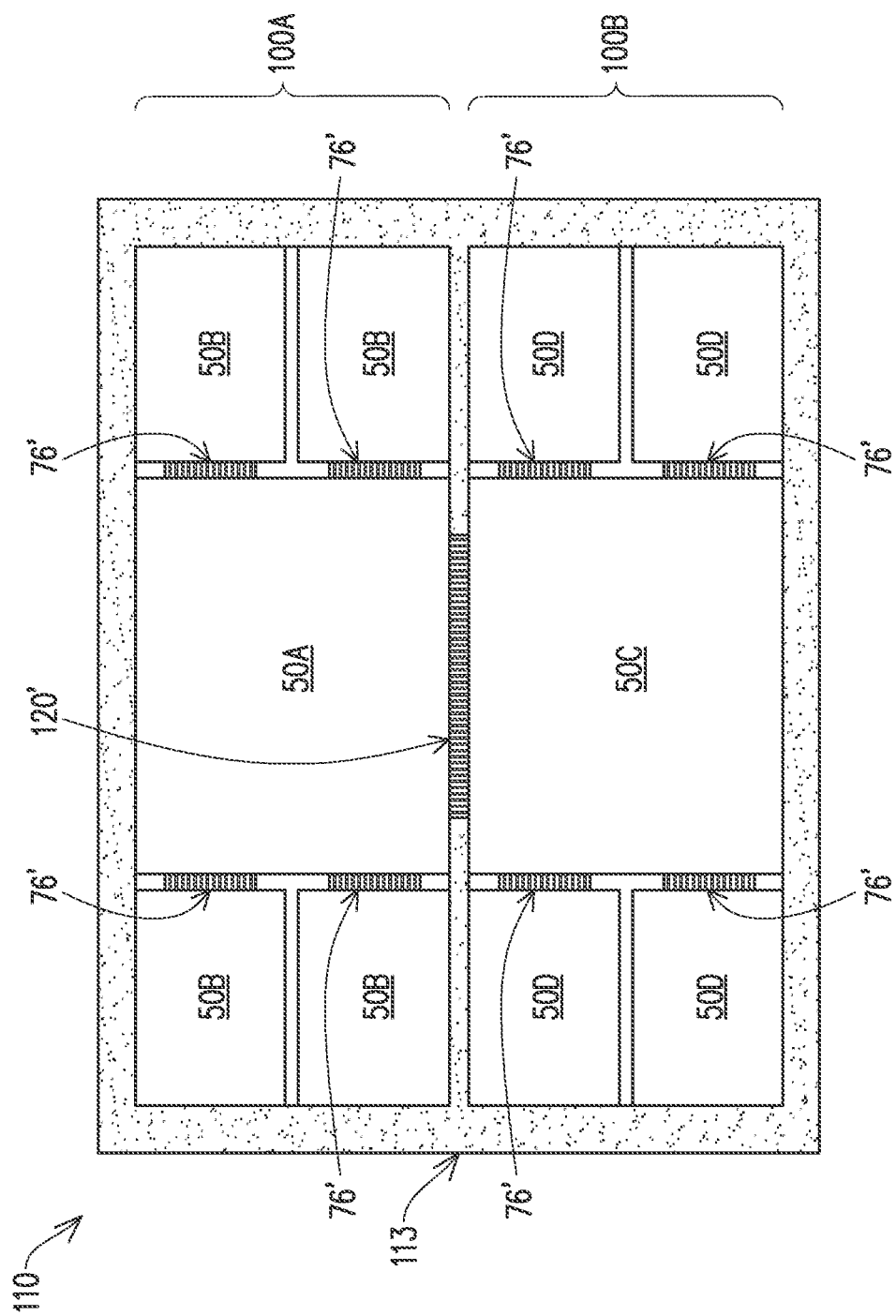
FIG. 14 is a plan view of an intermediate step during a process for forming device packages, in accordance with some embodiments.

Turning to FIG. 14, a plan view of a device structure 110 is shown, in accordance with some embodiments. The device structure 110 shown in FIG. 14 is representative, and some features are not shown for clarity. The device structure 110 of FIG. 14 shows a particular embodiment using the ideas described with respect to FIG. 13. For example, the device structure 110 includes a device package 100A and a device package 100B, which may be the same as or different than the device packages 100A or 100B described in FIG. 13. The device structure 110 shown in FIG. 14 includes two device packages 100A and 100B, but in other embodiments the device structure 110 may include three or more device packages 100. The device packages 100 may have any suitable configuration or arrangement within the device structure 110.

In some embodiments, within a device structure 110, different device packages 100 may be electrically connected by the redistribution structure 120, and integrated circuit devices 50 within each device package 100 may be electrically connected by the interconnect structure 76 of the device package 100. This is shown in FIG. 14, in which the integrated circuit device 50A of the device package 100A is connected to the integrated circuit devices 50B by the interconnect structure 76 of the device package 100A, and the integrated circuit device 50C of the device package 100B is connected to the integrated circuit devices 50D by the interconnect structure 76 of the device package 100B. The connections between integrated circuit devices 50 within each device package 100 are shown in FIG. 14 by a portion 76' of each interconnect structure 76. An example portion 76' is also indicated in FIG. 13, though the portions 76' indicated are FIGS. 13-14 is illustrative and may be different than shown. As shown in FIG. 14, the device package 100A is electrically connected to the device package 100B by the redistribution structure 120. The connections between the device packages 100 are shown in FIG. 14 by a portion 120' of the redistribution structure 120. An example portion 120' is also indicated in FIG. 13, though the portions 120' indicated in FIGS. 13-14 are illustrative and may be different than shown.

By using both interconnect structures 76 and a redistribution structure 120 in a device structure 110, the device structure 110 may incorporate multiple device packages 100 having multiple integrated circuit devices 50. Due to the use of multiple smaller interposers 76 as described above, the conductive traces (e.g., RDLs) of the interconnect structures 76 may be formed having smaller feature sizes than the conductive traces (e.g., RDLs) of the redistribution structure 120. For example, features on the interposers 76 may be formed using reticles with larger pattern reduction than the pattern reduction options available for forming features on the redistribution structure 120. For example, the conductive traces of an interconnect structure 76 may have linewidths between about 0.1 µm and about 3 µm and the conductive traces of a redistribution structure 120 may have linewidths between about 1 µm and about 20 µm. In some cases, the interconnect structures 76 may have better high-frequency performance than the redistribution structure 120 due to the smaller feature sizes of the interconnect structures 76. Thus, the device structure 110 may allow for improved higher-frequency electrical communication between integrated circuit devices 50 using the interconnect structures 76, for which higher-frequency operation may be desirable. Additionally, electrical communication between device packages 100 at lower frequencies may be adequate, for which the redistribution structure 120 may be used without negatively impacting performance.

Figure 15:
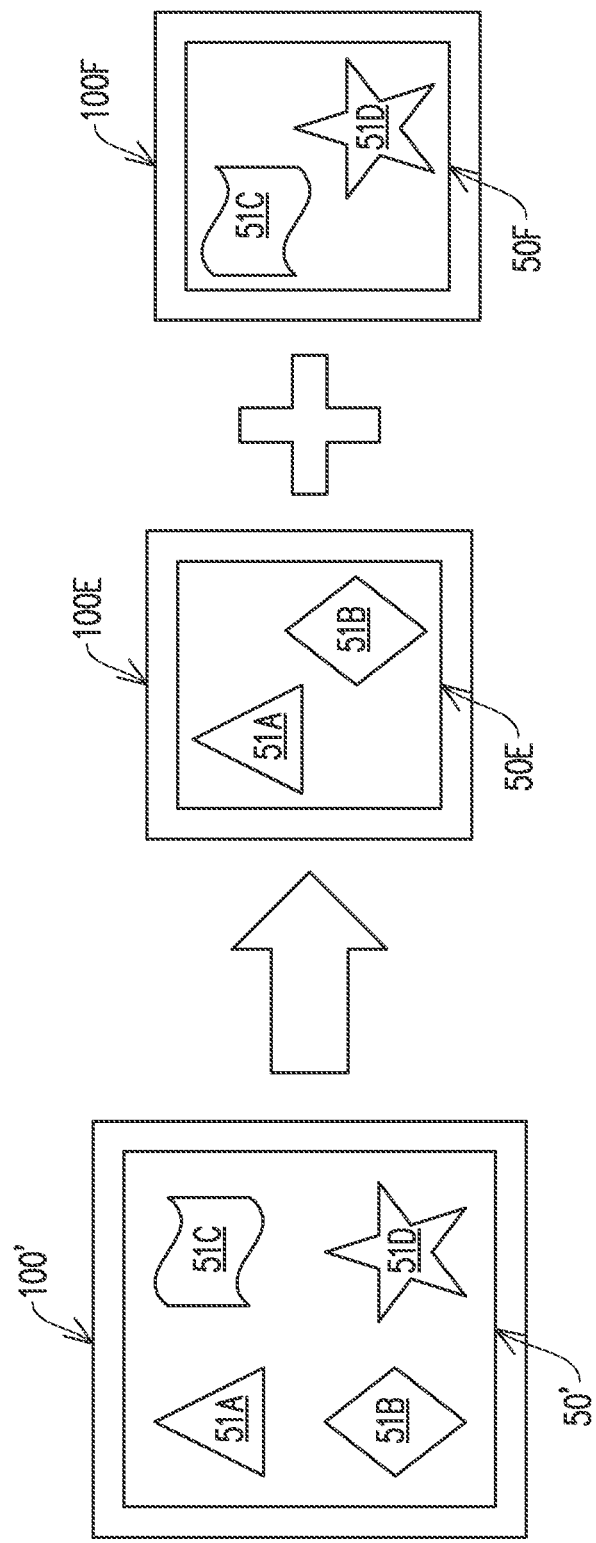
FIG. 15 is a schematic diagram of a device package, in accordance with some embodiments.

Turning to FIGS. 15-16, in some embodiments, the functionality of a single integrated circuit device 50 may be separated into multiple integrated circuit devices 50 that are electrically connected by the redistribution layer 120 of the device structure 110. As an illustrative example, FIG. 15 shows a schematic diagram representing a device package 100' including a single integrated circuit device 50' having multiple functional components 51A-D. The functional components 51A-D may be, for example, modules, circuits, or the like, or portions thereof or combinations thereof. The functional components 51A-D shown are illustrative, and an integrated circuit device 50 may have more, fewer, or different types of functional components than described. As shown in FIG. 15, rather than forming a single larger-area integrated circuit device 50' on one device package 100', the functional components 51A-D of the integrated circuit device 50' may be divided between two smaller-area integrated circuit devices 50E and 50F on two separate device packages 100E and 100F. In this manner, the features of the smaller-area device packages 100E and 100F may be formed having smaller size than the features of the larger-area device package 100', as described above. Thus, some benefits of smaller feature sizes may be achieved by using multiple integrated circuit devices 50 on multiple device packages 100 within a device structure 110 instead of using a single integrated circuit device 50 on a single device package 100. In other embodiments, the functionality of a single integrated circuit device 50 may be divided into more than two smaller integrated circuit devices 50, and, accordingly, the associated device structure 110 may have more than two device packages 100.

Figure 17:
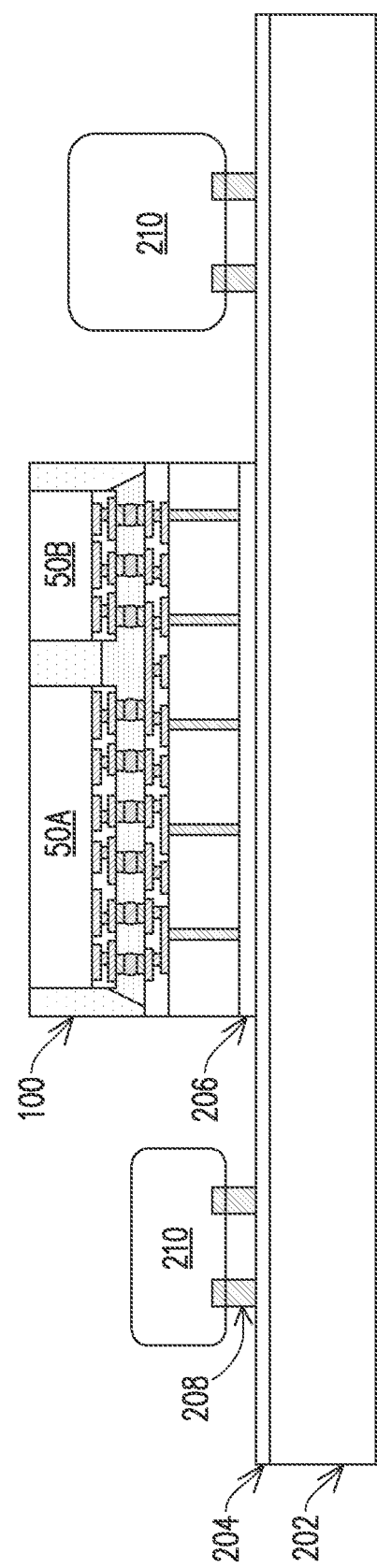
FIGS. 17-22 are cross-sectional views of intermediate steps during a process for forming package structures, in accordance with some embodiments.
Figure 18:
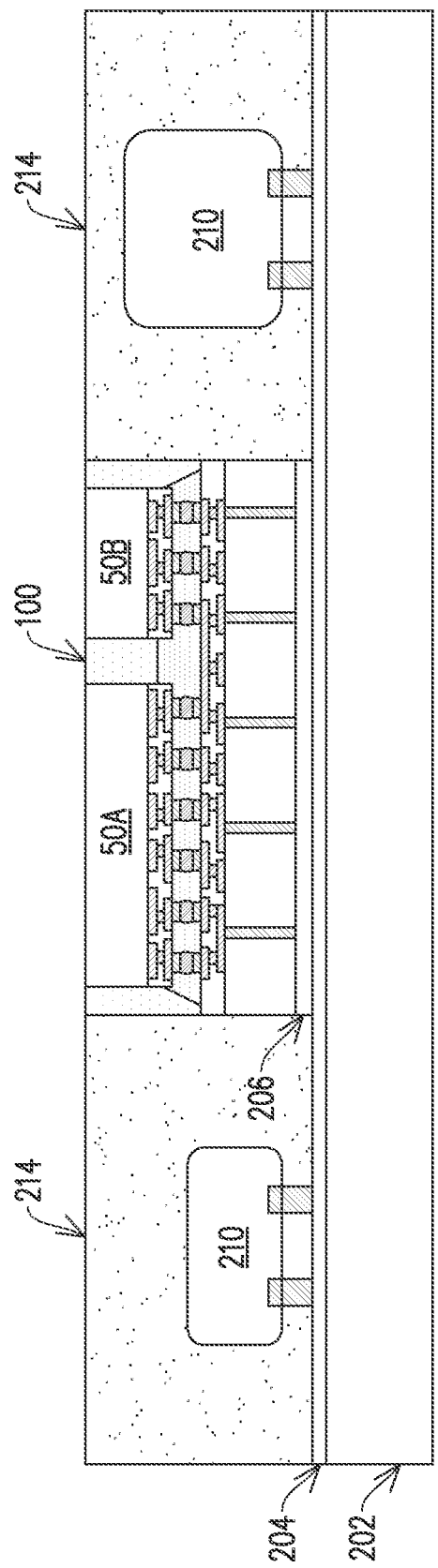
Figure 19:
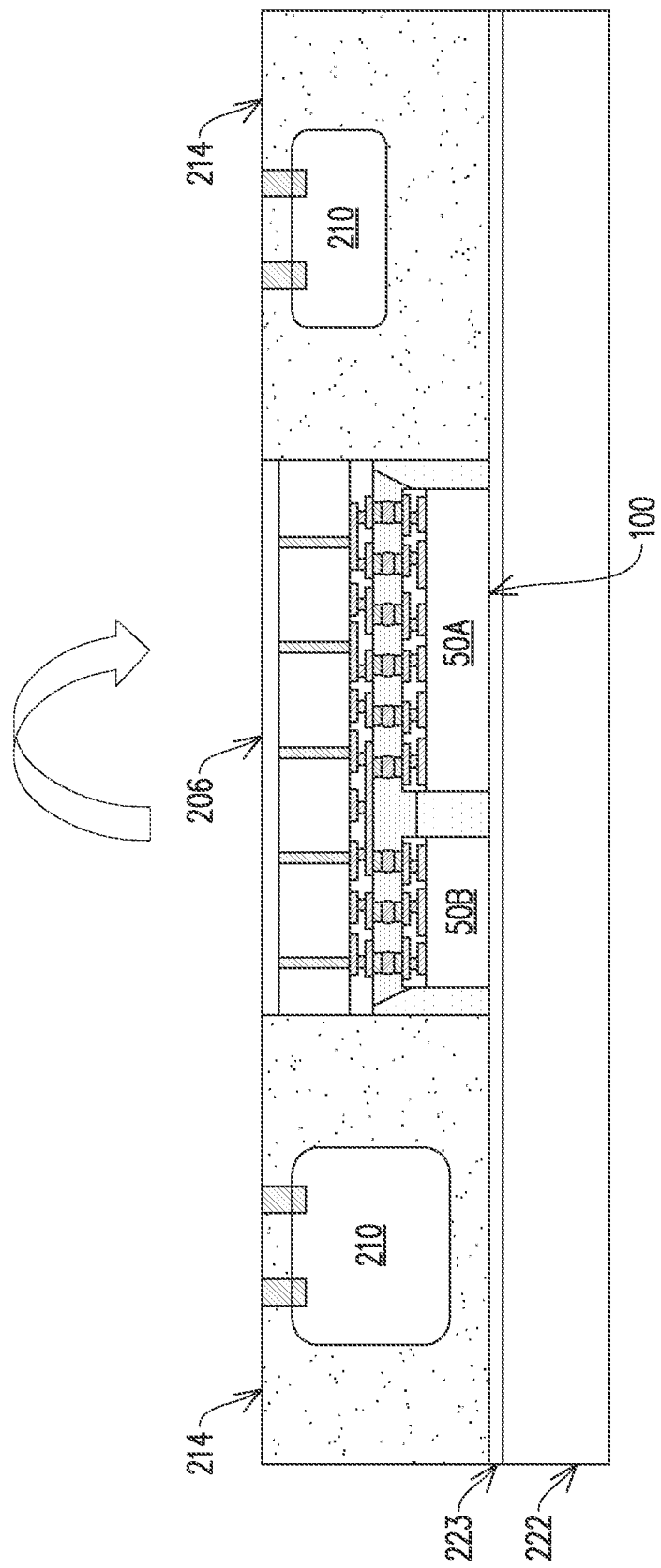
Figure 20:
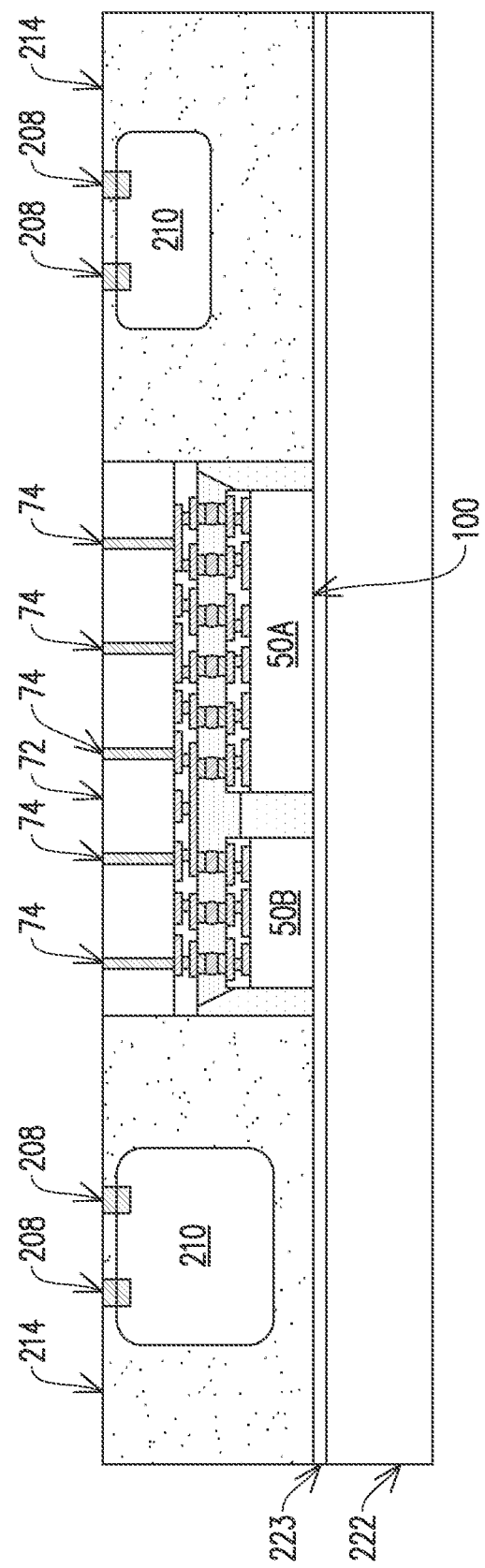
Figure 21:
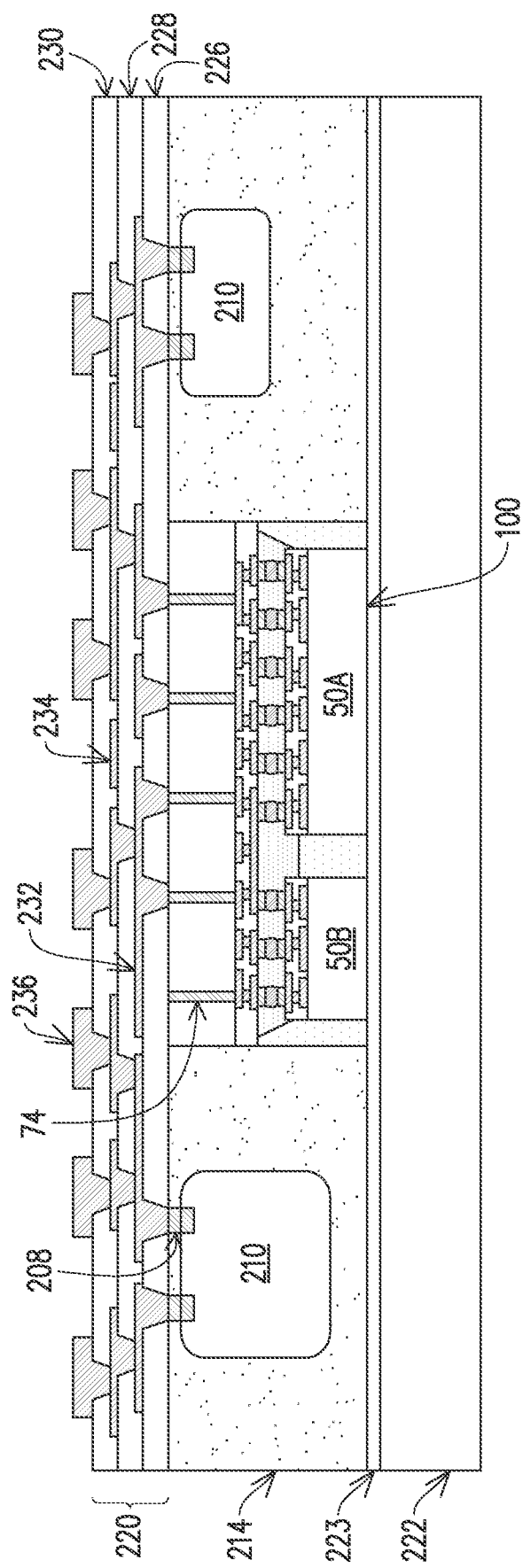
Figure 22:
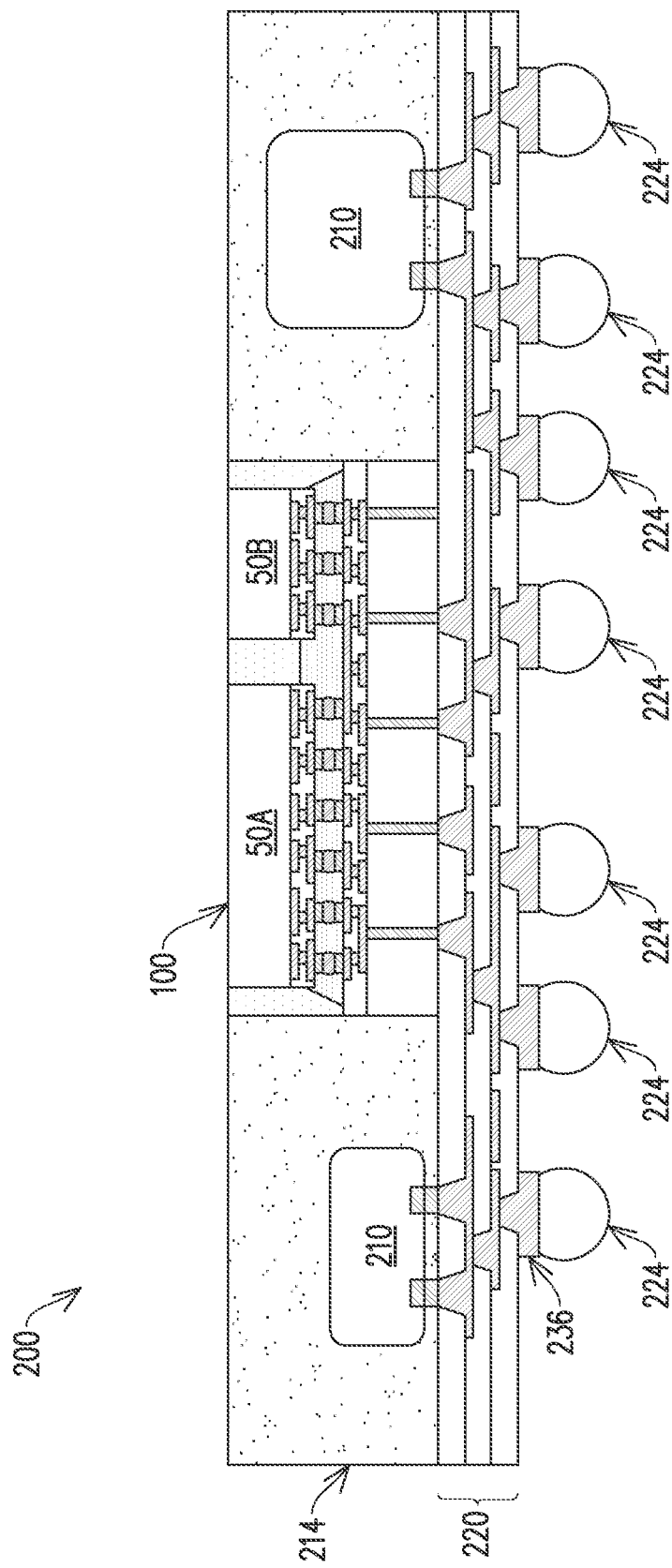

FIGS. 16A through 22 are cross-section views of intermediate steps during a process for forming a package structure 200 (see FIG. 22), in accordance with some embodiments. The package structure 200 includes one or more device packages 100 electrically connected to a side of a redistribution structure 220, and one or more electronic devices 210 electrically connected to the same side of the redistribution structure 220. In FIGS. 16A through 18, a device package 100 is attached to a first carrier 202 and electronic devices 210 are attached to conductive pads 208 formed on the first carrier 202. In FIGS. 19 through 20, the structure is removed from the first carrier 202 and mounted to a second carrier 222. In FIGS. 21 through 22, the redistribution structure 220 and external connectors 224 are formed over the device packages 100 and the electronic devices 210, forming the package structure 200.

Figure 16A:
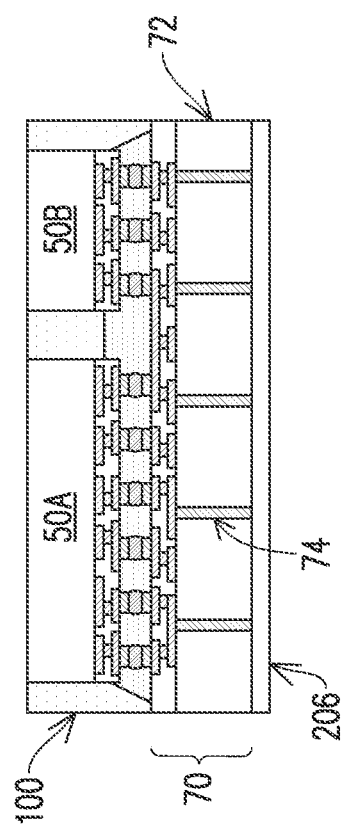
FIGS. 16A-C are cross-sectional views of intermediate steps during a process for forming package structures, in accordance with some embodiments.
Figure 16B:
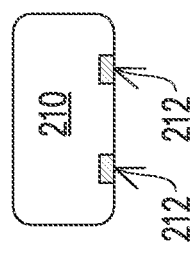
Figure 16C:
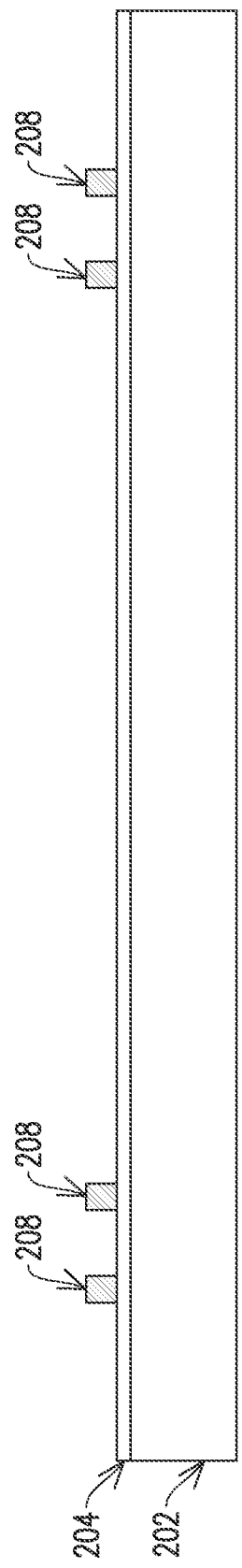

FIGS. 16A-C show a device package 100, an electronic device 210, and a first carrier 202 prior to attachment of the device package 100 and electronic device 210 to the first carrier 202, in accordance with some embodiments. FIG. 16A shows a device package 100 with an adhesive 206 formed over the interposer 70 of the device package 100, in accordance with some embodiments. The device package 100 may be similar to the device packages 100 described previously, such as described in FIG. 9. The adhesive 206 may be any suitable adhesive, epoxy, die attach film (DAF), or the like.

FIG. 16B shows an electronic device 210, in accordance with some embodiments. The electronic device 210 may be, for example, a semiconductor device or other device that includes one or more active devices and/or one or more passive devices such as capacitors, resistors, inductors, and the like. The electronic device 210 may be, for example, an integrated passive device (IPD). In some embodiments, the electronic device 210 is a passive device comprising a capacitor, such as a multi-layer ceramic capacitor (MLCC) or the like. In some embodiments, the electronic device 210 may be a surface-mount device (SMD) or the like. In some embodiments, the electronic device 210 has a thickness between about 50 μm and about 600 μm. The electronic device 210 includes one or more connectors 212 that provide electrical connection between an external component and the electronic device 210. The connectors 212 may be, for example, conductive bumps, pads, leads, solder balls, or the like.

FIG. 16C shows a first carrier 202, which may be a suitable support structure for subsequent processing. The first carrier 202 may be a glass carrier substrate, a ceramic carrier substrate, a wafer, a panel, or the like. The first carrier 202 may be a wafer, such that multiple packages can be formed on the carrier 202 simultaneously. A release layer 204 may be formed on the first carrier 202. The release layer 204 may be formed of a polymer-based material, which may be removed along with the first carrier 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the first carrier 202, a DAF, or the like. The top surface of the release layer 204 may be leveled and may have a high degree of coplanarity.

Still referring to FIG. 16C, conductive connectors 208 may be formed over the release layer 204. The conductive connectors 208 may be conductive pads, bumps, pillars, or the like, and are subsequently connected to the connectors 212 of the electronic devices 210 to provide electrical connection to the electronic devices 210. In some embodiments, the conductive connectors 208 may be formed by depositing a seed layer (not shown) over the release layer 204. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, a combination thereof, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive connectors 208.

Turning to FIG. 17, the device package 100 and the electronic devices 210 are attached to the first carrier 202, in accordance with some embodiments. FIG. 17 shows a single device package 100 and two electronic devices 210 attached to the first carrier 202, but more than one device package or more or fewer electronic devices 210 may be attached in other embodiments. The electronic devices 210 attached to the first carrier 202 may be similar electronic devices or may be different electronic devices.

The device package 100 and the electronic devices 210 may be placed on the first carrier 202 using, for example, a pick-and-place tool. The device package 100 may be attached to the release layer 204 on the first carrier 202 by the adhesive 206. The electronic devices 210 may be attached to the first carrier 202 by the conductive connectors 208. In some embodiments, the electronic devices 210 may be attached to the conductive connectors 208, for example, by sequentially dipping the connectors 212 of the electronic devices 210 into a solder material and/or a flux material, and then using a pick-and-place tool in order to physically align the connectors 212 with conductive connectors 208. In some embodiments, a solder material (e.g., a solder paste) may first be applied to the conductive connectors 208 before placement of the electronic devices 210. In some cases, after placement of the electronic devices 210, a reflow may be performed to bond the connectors 212 to the conductive connectors 208.

In some cases, by attaching the electronic devices 210 to the first carrier 202 in this manner, the electronic devices 210 may be located closer to the device package 100 in the final package structure 200 (see FIG. 22). For example, in some embodiments, the electronic devices 210 may be separated from the device package 100 by a distance D that is between about 300 μm and about 30,000 μm. By locating the electronic devices closer to the device package 100, electrical resistance may be reduced, and the device performance may be improved, particularly for operation at higher frequencies. Additionally, by attaching the electronic devices 210 to the first carrier, multiple electronic devices 210 having multiple thicknesses may be used in the same package structure 200, while not increasing the overall thickness of the package structure 200. The electronic devices 210 may also be protected by an encapsulant 214 (see FIG. 18), which can improve device reliability.

In FIG. 18, an encapsulant 214 is formed on the various components of the structure. The encapsulant 214 may be a molding compound, epoxy, or the like, and may be applied by compression molding, transfer molding, or the like. The encapsulant 214 may be formed over the device package 100 and the electronic devices 210 such that the device package 100 and the electronic devices 210 are surrounded and covered by the encapsulant 214. The encapsulant 214 may then be cured. In some embodiments, excess material of the encapsulant 214 is removed (e.g., by CMP), which may also planarize the top of the structure such that top surfaces of the encapsulant 214 and top surfaces of the device package 100 are level.

In FIG. 19, a carrier de-bonding is performed to detach (de-bond) the first carrier 202 from the structure, which is then attached to a second carrier 222. In accordance with some embodiments, the de-bonding includes projecting a light such as a laser light or an ultraviolet (UV) light on the release layer 204 so that the release layer 204 decomposes under the heat of the light and the first carrier 202 can be removed. The structure is then flipped over and attached to a second carrier 222. The second carrier 222 may be similar to the first carrier 202, such as comprising a glass carrier substrate, a ceramic carrier substrate, a wafer, a panel, or the like. A release layer 223 may be formed on the second carrier 222, and the structure may be attached to the release layer 223. The release layer 223 may be e.g., a DAF or the like, or may be similar to the release layer 204 described above.

In FIG. 20, a planarization process is performed on the bottom of the structure, in accordance with some embodiments. The planarization process may be, for example, a CMP. In some embodiments, the planarization process may remove the adhesive 206 and may expose the conductive connectors 208 and the through vias 74 of the device package 100. In some cases, the planarization process may also planarize the structure such that bottom surfaces of the encapsulant 214 and bottom surfaces of the device package 100 are level.

In FIG. 21, a redistribution structure 220 is formed over the bottom of the structure, in accordance with some embodiments. The redistribution structure 220 provides electrical interconnection between the electronic devices 210, the device package 100, and external components. The redistribution structure 220 includes dielectric layers 226, 228, and 230, and includes metallization patterns 232 and 234. The metallization patterns may also be referred to as redistribution layers (RDLs) or redistribution lines. The redistribution structure 220 is shown as an example having two layers of metallization patterns. More or fewer dielectric layers and metallization patterns may be formed in the redistribution structure 220. If fewer dielectric layers and metallization patterns are to be formed, steps and process discussed below may be omitted. If more dielectric layers and metallization patterns are to be formed, steps and processes discussed below may be repeated.

In FIG. 21, the dielectric layer 226 is deposited on the encapsulant 214, through vias 74, and conductive connectors 208. In some embodiments, the dielectric layer 226 is formed of a photo-sensitive material such as PBO, polyimide, BCB, or the like, which may be patterned using a lithography mask. The dielectric layer 226 may be formed by spin coating, lamination, CVD, the like, or a combination thereof. The dielectric layer 226 is then patterned. The patterning forms openings exposing portions of the through vias 74 and the conductive connectors 208. The patterning may be by an acceptable process, such as by exposing the dielectric layer 226 to light when the dielectric layer 226 is a photo-sensitive material or by etching using, for example, an anisotropic etch. If the dielectric layer 226 is a photo-sensitive material, the dielectric layer 226 can be developed after the exposure.

The metallization pattern 232 is then formed, in accordance with some embodiments. The metallization pattern 232 includes line portions (also referred to as conductive lines) on and extending along the major surface of the dielectric layer 226. The metallization pattern 232 further includes via portions (also referred to as conductive vias) extending through the dielectric layer 226 to physically and electrically couple the through vias 74 and the conductive connectors 208. As an example to form the metallization pattern 232, a seed layer is formed over the dielectric layer 226 and in the openings extending through the dielectric layer 226. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 232. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 232. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After formation of the metallization pattern 232, the dielectric layer 228 is deposited on the metallization pattern 232 and dielectric layer 226. The dielectric layer 228 may be formed and patterned in a manner similar to the dielectric layer 226, and may be formed of a similar material as the dielectric layer 226.

The metallization pattern 234 is then formed, in accordance with some embodiments. The metallization pattern 234 includes line portions on and extending along the major surface of the dielectric layer 228. The metallization pattern 234 further includes via portions extending through the dielectric layer 228 to physically and electrically couple the metallization pattern 232. The metallization pattern 234 may be formed in a similar manner and of a similar material as the metallization pattern 232. In some embodiments, the metallization pattern 234 has a different size than the metallization pattern 232. For example, the conductive lines and/or vias of the metallization pattern 234 may be wider or thicker than the conductive lines and/or vias of the metallization pattern 232. Further, the metallization pattern 234 may be formed to a greater pitch than the metallization pattern 232.

The dielectric layer 230 is deposited on the metallization pattern 234 and dielectric layer 228. The dielectric layer 230 may be formed in a manner similar to the dielectric layer 228, and may be formed of the same material as the dielectric layer 226. The dielectric layer 230 is the topmost dielectric layer of the redistribution structure 220. As such, all of the metallization patterns of the redistribution structure 220 (e.g., the metallization patterns 232 and 234) are disposed between the dielectric layer 230 and the device package 100. Further, all of the intermediate dielectric layers of the redistribution structure 220 (e.g., the dielectric layers 226 and 228) are disposed between the dielectric layer 230 and the device package 100.

In some embodiments, UBMs 236 are formed for external connection to the redistribution structure 220. The UBMs 236 may include conductive portions on and extending along the major surface of the dielectric layer 230. The UBMs 236 further include conductive vias extending through the dielectric layer 230 to be physically and electrically connected to the metallization pattern 234. The UBMs 236 may be formed of the same material as the metallization pattern 232 or a different material. For example, the UBMs 236 may include copper or copper alloys. However, other metals, such as titanium, nickel, palladium, silver, gold, aluminum, combinations thereof, and multi-layers thereof, may also be included. The UBMs 236 may be formed using sputtering, electroplating, or the like. In some embodiments, the UBMs 236 have a different size than the metallization patterns 232 or 234.

In some cases, by forming a redistribution structure 220 as described, multiple electronic devices 210 may be connected to at least one device package 100 without the use of a separate interposer or substrate. Additionally, the use of a redistribution structure 220 allows for a package to include components (e.g., device packages 100 or electronic devices 210) without additional bonding steps (e.g., friction bonding a device package 100 to an interposer), deposition of underfill, or other related processing steps. In this manner, the cost and number of process steps for forming a package may be reduced. Additionally, the use of two carriers (e.g., 202 and 222) during processing can reduce the amount of warping of the structure during processing.

In FIG. 22, external connectors 224 are formed on the UBMs 138. The external connectors 224 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The external connectors 224 may include a conductive material such as solder, copper, aluminum, gold, nickel, silver, palladium, tin, the like, or a combination thereof. In some embodiments, the external connectors 224 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the external connectors 224 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Still referring to FIG. 22, a carrier de-bonding is performed to detach (debond) the second carrier 222 from the structure, forming the package structure 200. In accordance with some embodiments, the debonding includes projecting a light such as a laser light or an ultraviolet (UV) light on the release layer 224 so that the release layer 224 decomposes under the heat of the light and the second carrier 222 can be removed. The structure may then flipped over and placed on a tape (not shown). The structure may then be singulated to form the package structure 200. The singulation may be by sawing, dicing, or the like. As a result of the singulation process, edges of the redistribution structure 220 and the encapsulant 214 may be coplanar.

In this manner, a package structure 200 may be formed with electronic devices 210 having different thicknesses without increasing the overall thickness of the package structure 200. Additionally, by forming the package structure 200 with a redistribution structure 220 as described herein, the package structure 200 may be formed without the use of an additional interposer or substrate, which can reduce manufacturing cost and reduce the number of processing steps.

Figure 24:
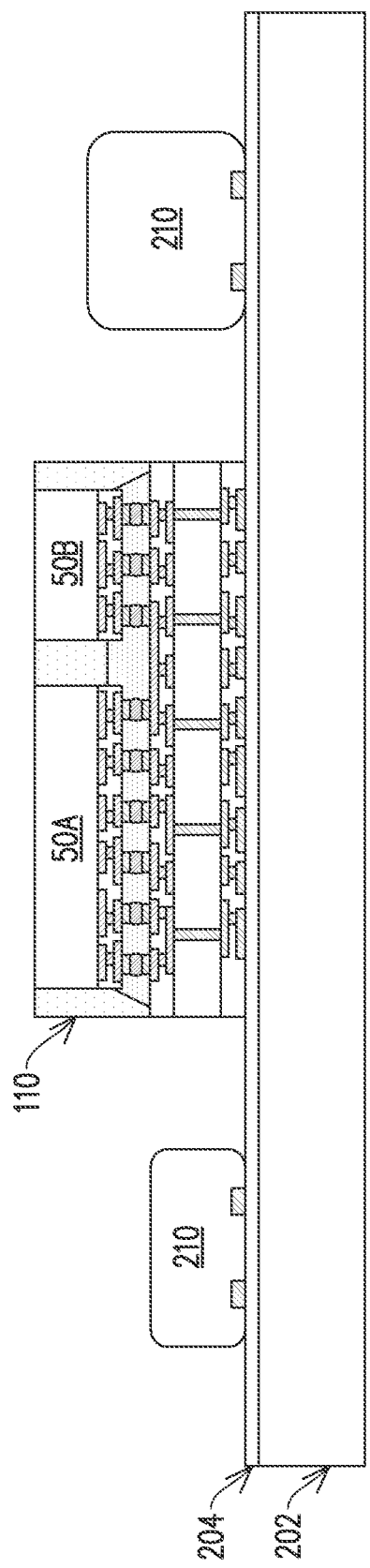
FIGS. 24-28 are cross-sectional views of intermediate steps during a process for forming package structures, in accordance with some embodiments.
Figure 25:
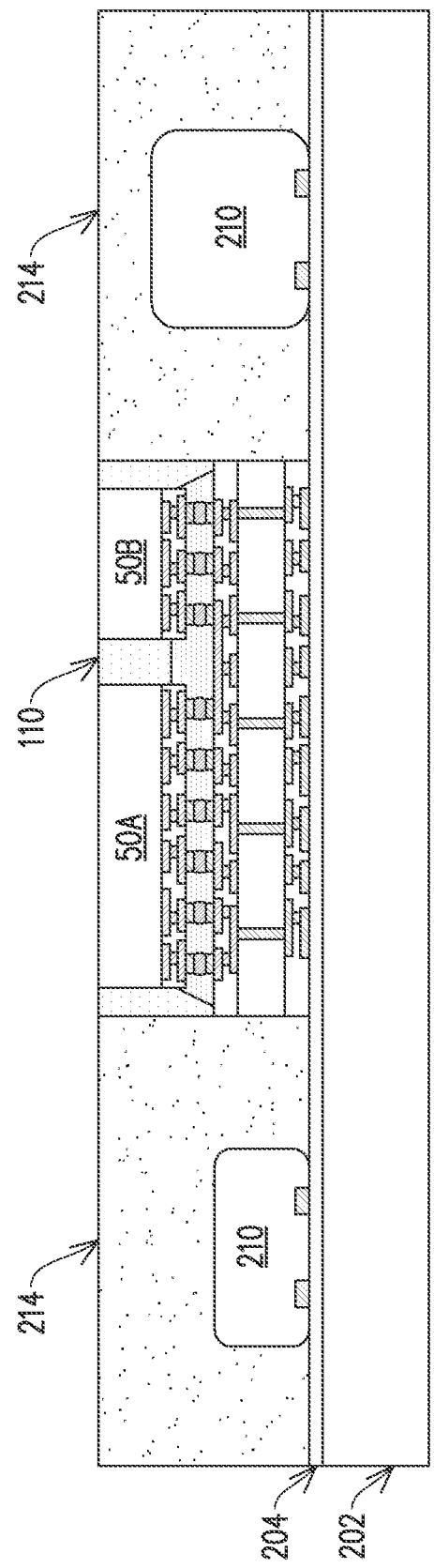
Figure 26:
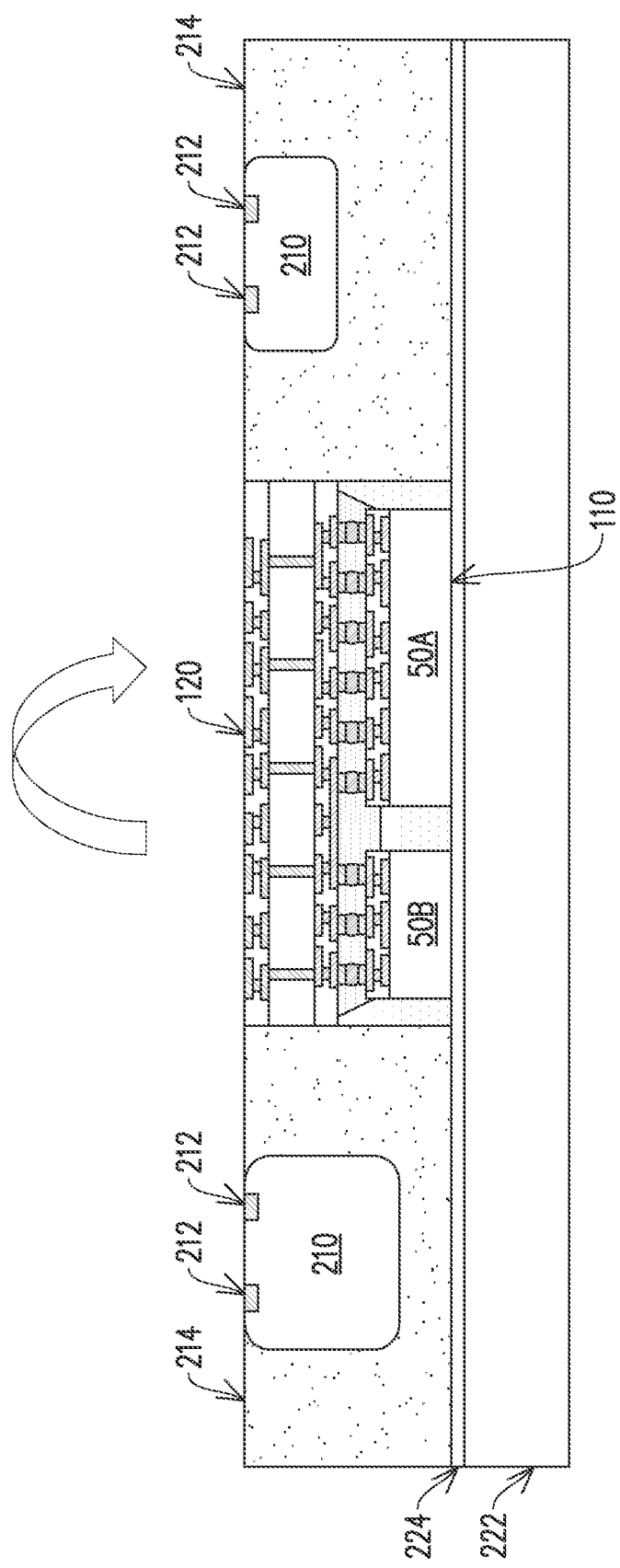
Figure 27:
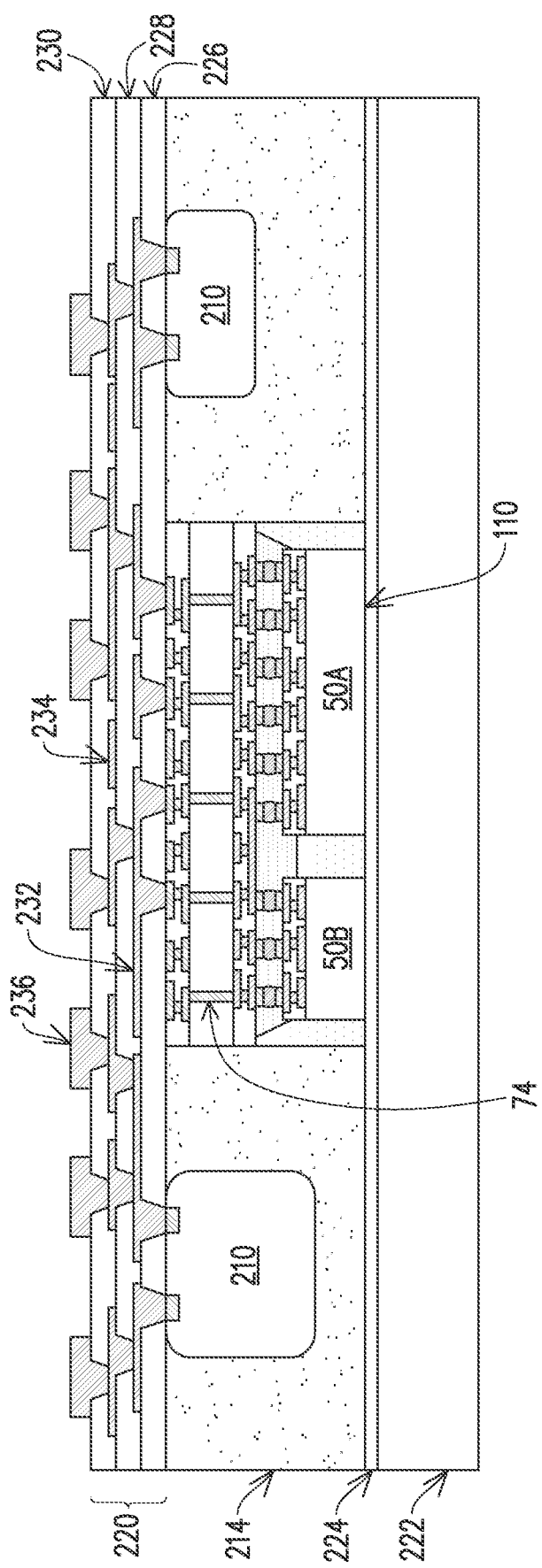
Figure 28:
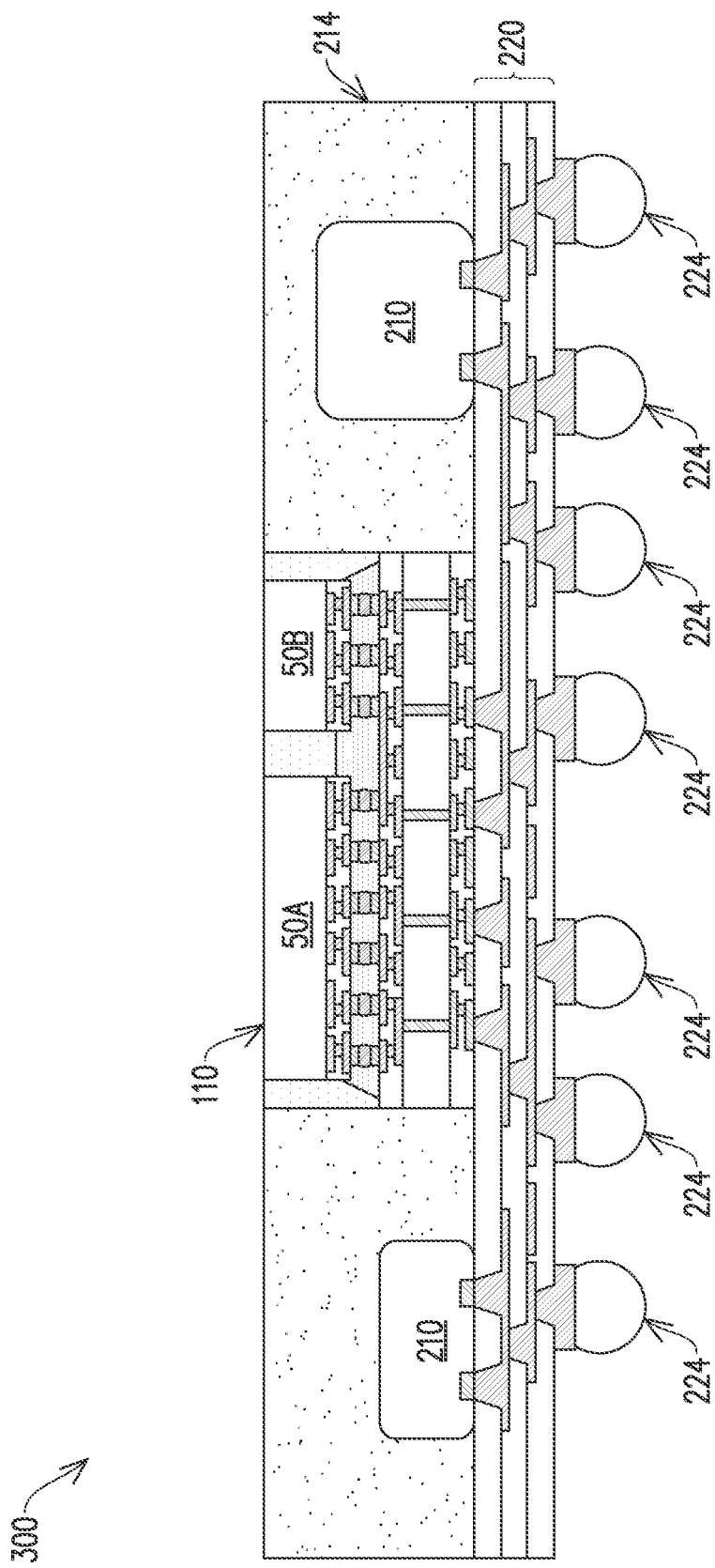

FIGS. 23A through 28 are cross-section views of intermediate steps during a process for forming a package structure 300 (see FIG. 28), in accordance with some embodiments. The package structure 300 is similar to the package structure 200, except that an adhesive 206 and conductive connectors 208 are not used. In this manner, the number of processing steps for forming package structure 300 may be fewer than those for forming package structure 300. The package structure 300 includes one or more device structure 110 electrically connected to a side of a redistribution structure 220, and one or more electronic devices 210 electrically connected to the same side of the redistribution structure 220. While the package structure 300 described in FIGS. 23A through 28 is shown using a device structure 110 (see FIG. 14), in other embodiments a package structure 300 may use device packages 100 (see FIG. 9) instead of or in addition to device structures 110. In FIGS. 23A through 25, a device structure 110 and electronic devices 210 are attached to a first carrier 202. In FIG. 26, the structure is removed from the first carrier 202 and mounted to a second carrier 222. In FIGS. 27 through 28, the redistribution structure 220 and external connectors 224 are formed over the device structure 110 and the electronic devices 210, forming the package structure 300.

Figure 23A:
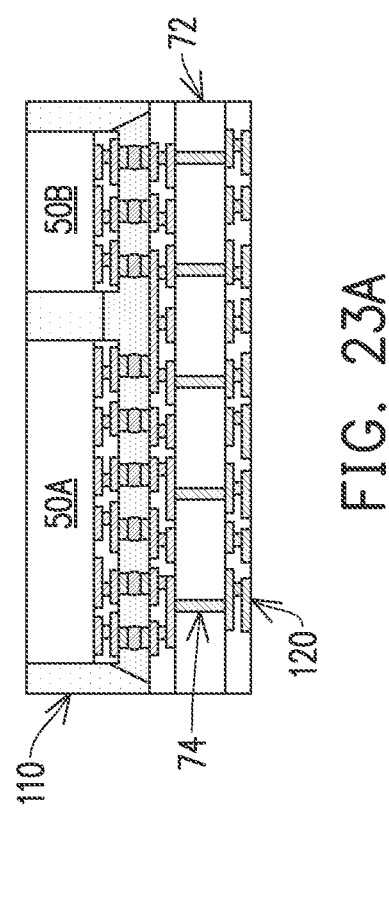
FIGS. 23A-C are cross-sectional views of intermediate steps during a process for forming package structures, in accordance with some embodiments.
Figure 23B:
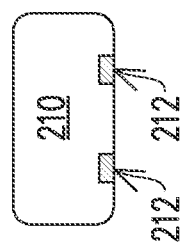
Figure 23C:
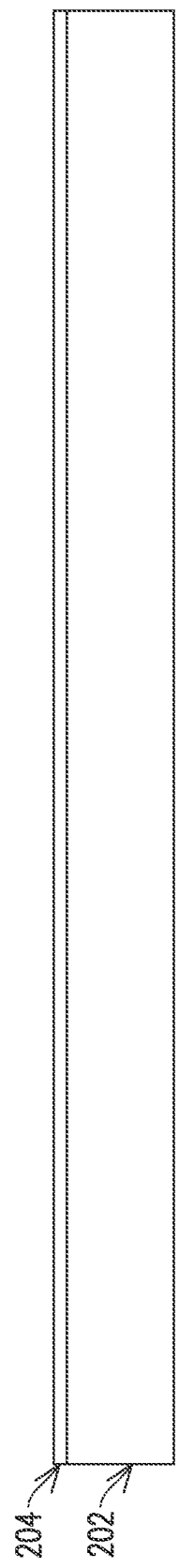

FIGS. 23A-C show a device structure 110, an electronic device 210, and a first carrier 202 prior to attachment of the device structure 110 and electronic device 210 to the first carrier 202, in accordance with some embodiments. FIG. 23A shows a device structure 110, which may be similar to the device structure 110 described previously, such as described in FIG. 14. FIG. 16B shows an electronic device 210, which may be similar to an electronic device 210 described previously. The electronic device 210 includes one or more connectors 212 that provide electrical connection between an external component and the electronic device 210. FIG. 16C shows a first carrier 202, which may be a suitable support structure for subsequent processing. The first carrier 202 may be similar to the first carrier 202 described previously. A release layer 204 may be formed on the first carrier 202, which may be similar to the release layer 204 described previously.

Turning to FIG. 24, the device structure 110 and the electronic devices 210 are attached to the first carrier 202, in accordance with some embodiments. FIG. 24 shows a single device structure 110 and two electronic devices 210 attached to the first carrier 202, but one or more device structures 110, one or more device packages 100, and/or one or more electronic devices 210 may be attached in other embodiments. The electronic devices 210 attached to the first carrier 202 may be similar electronic devices or may be different electronic devices, and may have different thicknesses, as shown in FIG. 24. The device structure 110 and the electronic devices 210 may be placed on the first carrier 202 using, for example, a pick-and-place tool.

In some cases, by attaching the electronic devices 210 to the first carrier 202 in this manner, the electronic devices 210 may be located closer to the device structure 110 in the final package structure 300 (see FIG. 28). By locating the electronic devices closer to the device structure 110, electrical resistance may be reduced, and the device performance may be improved, particularly for operation at higher frequencies. Additionally, by attaching the electronic devices 210 to the first carrier, electronic devices 210 having different sizes or different heights may be used, while not increasing the overall thickness of the final package structure 300. The electronic devices 210 may also be protected by an encapsulant 214 (see FIG. 25), which can improve device reliability.

In FIG. 25, an encapsulant 214 is formed on the various components of the structure. The encapsulant 214 may be a molding compound, epoxy, or the like, and may be applied by compression molding, transfer molding, or the like. The encapsulant 214 may be formed over the device structure 110 and the electronic devices 210 such that the device structure 110 and the electronic devices 210 are surrounded and covered by the encapsulant 214. The encapsulant 214 may then be cured. In some embodiments, excess material of the encapsulant 214 is removed (e.g., by CMP), which may also planarize the top of the structure such that top surfaces of the encapsulant 214 and top surfaces of the device structure 110 are level.

In FIG. 26, a carrier de-bonding is performed to detach (de-bond) the first carrier 202 from the structure, which is then attached to a second carrier 222. In accordance with some embodiments, the de-bonding includes projecting a light such as a laser light or an ultraviolet (UV) light on the release layer 204 so that the release layer 204 decomposes under the heat of the light and the first carrier 202 can be removed. The structure is then flipped over and attached to a second carrier 222. The second carrier 222 may be similar to the first carrier 202 or the second carrier 222 described previously. A release layer 224 may be formed on the second carrier 222, and the structure may be attached to the release layer 224. The release layer 224 may be e.g., a DAF or the like, and may be similar to the release layer 224 described above.

In FIG. 27, a redistribution structure 220 is formed over the bottom of the structure, in accordance with some embodiments. The redistribution structure 220 provides electrical interconnection between the electronic devices 210, the device structure 110, and external components. The redistribution structure 220 may be similar to the redistribution structure 220 described previously in FIG. 21, and may be formed in a similar manner. For example, the redistribution structure 220 shown in FIG. 27 includes dielectric layers 226, 228, and 230, and includes metallization patterns 232 and 234. More or fewer dielectric layers and metallization patterns may be formed in the redistribution structure 220. In some embodiments, UBMs 236 are formed for external connection to the redistribution structure 220, which may be similar to the UBMs 236 described previously.

In some cases, by forming a redistribution structure 220 as described, multiple electronic devices 210 may be connected to at least one device structure 110 without the use of a separate interposer or substrate. Additionally, the use of a redistribution structure 220 allows for a package to include components (e.g., device structures 110, device packages 100, and/or electronic devices 210) without additional bonding steps (e.g., bonding a device structure 110 or a device package 100 to an interposer), deposition of underfill, or other related processing steps. In this manner, the cost and number of process steps for forming a package may be reduced. Additionally, the use of two carriers (e.g., 202 and 222) during processing can reduce the amount of warping of the structure during processing.

In FIG. 28, external connectors 224 are formed on the UBMs 236. The external connectors 224 may be similar to the external connectors 224 described previously. Still referring to FIG. 28, a carrier de-bonding is performed to detach (debond) the second carrier 222 from the structure, forming the package structure 300. In accordance with some embodiments, the debonding includes projecting a light such as a laser light or an ultraviolet (UV) light on the release layer 224 so that the release layer 224 decomposes under the heat of the light and the second carrier 222 can be removed. The structure may then be flipped over and placed on a tape (not shown). The structure may then be singulated to form the package structure 300. The singulation may be by sawing, dicing, or the like. As a result of the singulation process, edges of the redistribution structure 220 and the encapsulant 214 may be coplanar.

In this manner, a package structure 300 may be formed with electronic devices 210 having different thicknesses without increasing the overall thickness of the package structure 300. Additionally, by forming the package structure 300 with a redistribution structure 220 as described herein, the package structure 300 may be formed without the use of an additional interposer or substrate, which can reduce manufacturing cost and reduce the number of processing steps. Additionally, the package structure 300 may be formed without the inclusion of conductive connectors 208 or adhesive 206, further reducing processing cost and steps.

Figure 29:
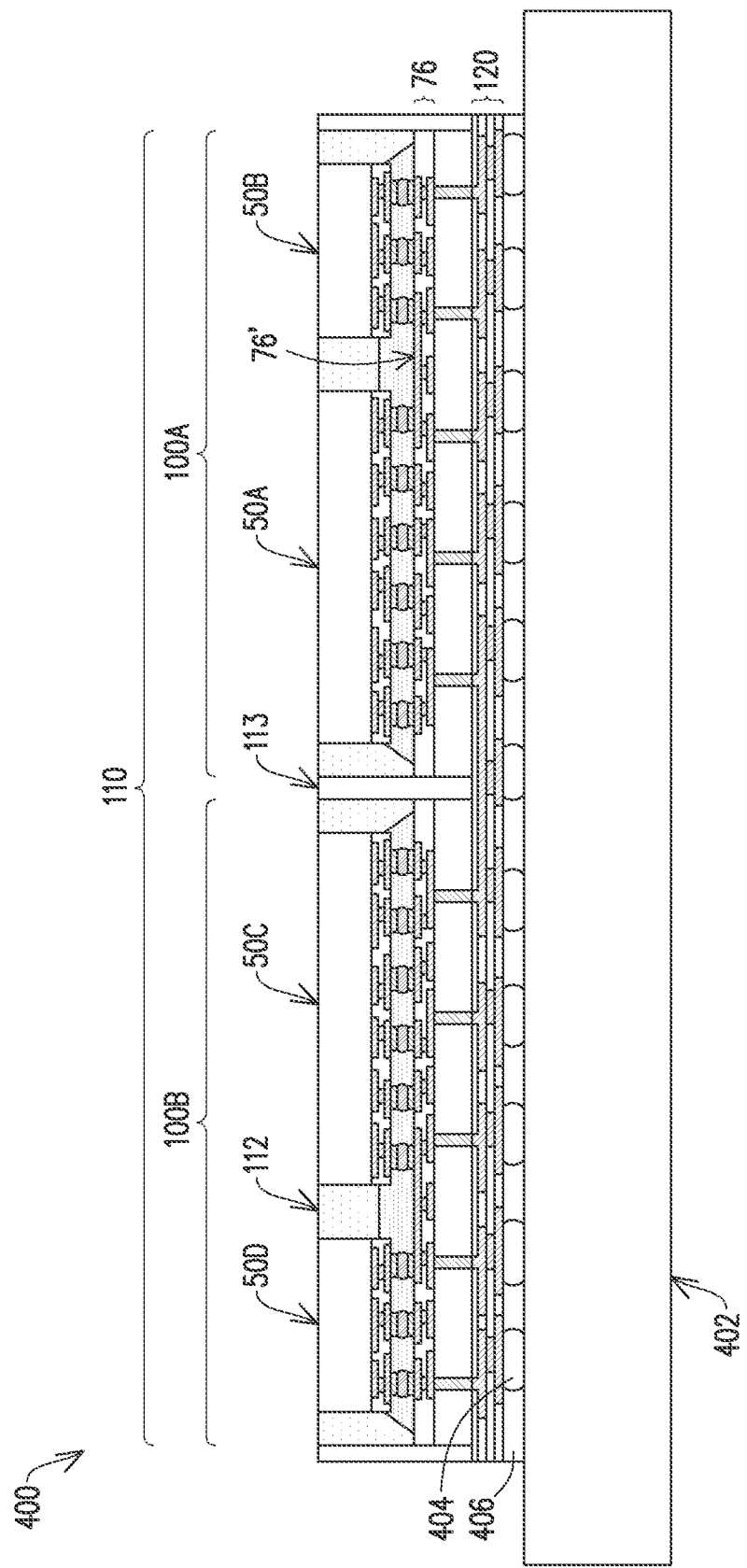
FIG. 29 is a cross-sectional view of a package structure, in accordance with some embodiments.

Turning to FIG. 29, a package structure 400 is shown, in accordance with some embodiments. The package structure 400 includes a device structure 110 that is bonded to an IC substrate 402 by connectors 404. The device structure 110 may be similar to the device structures described previously, such as that described in FIG. 13. The IC substrate 402 may be a bulk semiconductor substrate, SOI substrate, multi-layered semiconductor substrate, or the like. The semiconductor material of the IC substrate 402 may be silicon, germanium, a compound semiconductor including silicon germanium, silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, GaInAsP, combinations thereof, or the like. Other substrates, such as multi-layered or gradient substrates, may also be used. The IC substrate 402 may be doped or undoped. Devices, such as transistors, capacitors, resistors, diodes, and the like, may be formed in and/or on a surface of the IC substrate 402. For example, the IC substrate 402 may be a semiconductor substrate, chip, die, or the like in which integrated circuits (IC) have been formed, and which are electrically connected to the device structure 110 by the connectors 404. The IC substrate 402 is, in some embodiments, based on an insulating core such as a fiberglass reinforced resin core. For example, the core material may be fiberglass resin such as FR4, BT resin, other PCB materials or films, a combination, or the like. Build-up films such as ABF or other laminates may be used for the IC substrate 402.

In some embodiments, the connectors 404 are formed on the redistribution structure 120 of the device structure 110, and then the device structure 110 is placed on the IC substrate 402 such that the connectors 404 make electrical and physical connection to corresponding conductive features on the IC substrate 402. The connectors 404 may be similar to the connectors 224 described previously, and may be formed in a similar manner. In some cases, after placement of the device structure 110, a reflow may be performed to bond the connectors 404 to the corresponding conductive features on the IC substrate 402. After bonding the device structure 110 to the IC substrate 402, an underfill 406 may be deposited between the device structure 110 and the IC substrate 402.

In some embodiments, one or more electronic devices (not shown in FIG. 29) may also be connected to the IC substrate 402. The electronic devices may be similar to the electronic devices 210 described previously. The electronic devices may be connected to one side or both sides of the IC substrate 402. For example, the electronic devices may be attached to the IC substrate 402 on the same side as the device structure 110.

Embodiments may achieve advantages. By forming a device structure with multiple device packages connected by a redistribution structure, the sizes of each device package may be reduced, allowing for the device packages to be formed having finer features. For example, the metallization within the interposers of each device package may be formed having greater density and smaller linewidth, which can improve performance at higher frequencies. In some cases, the functionality of a single integrated circuit device can be separated into multiple device packages, which, due to the smaller size of each device package, can allow for improved metallization and improved performance as described. In some cases, the integrated circuit devices may be individually electrically tested before forming the device structure, which can improve yield. By forming a package structure using a two-carrier process, electronic components such as SMDs that have different thicknesses can be incorporated within the same package structure. Additionally, a redistribution structure may be used instead of an interposer within the package structure, which can reduce cost and processing steps.

In an embodiment, a method includes forming a device structure, which includes connecting a first die to a first interposer, connecting a second die to a second interposer, and forming a first redistribution structure over the first interposer and the second interposer, wherein the first redistribution structure electrically connects the first interposer to the second interposer, and forming a package structure, which includes attaching a first surface mounted device (SMD) and the device structure to a first carrier, encapsulating the first SMD and the device structure with a first encapsulant to form an encapsulated structure having a top surface and a bottom surface, attaching the top surface of the encapsulated structure to a second carrier, and forming a second redistribution structure over the bottom surface of the encapsulated structure, wherein the second redistribution structure electrically connects the first SMD and the device structure. In an embodiment, forming the package structure further includes attaching a second SMD to the first carrier, wherein the second SMD has a different thickness than the first SMD. In an embodiment, the method further includes planarizing the encapsulated structure, wherein after planarizing the encapsulated structure, a top surface of the first die and a top surface of the first encapsulant are level. In an embodiment, forming a device structure further includes encapsulating the first interposer and the second interposer with a second encapsulant, wherein the first redistribution structure extends over the second encapsulant. In an embodiment, a thickness of the first SMD is less than a thickness of the encapsulated structure. In an embodiment, the method further includes, after connecting the first die to the first interposer, electrically testing the first die before forming a first redistribution structure over the first interposer. In an embodiment, the sidewalls of the second redistribution structure are coplanar with the sidewalls of the encapsulated structure. In an embodiment, the method further includes forming external connectors on the second redistribution structure.

In an embodiment, a method includes attaching semiconductor devices to an interposer structure, attaching the interposer structure to a first carrier substrate, attaching integrated passive devices to the first carrier substrate, forming an encapsulant over the semiconductor devices and the integrated passive devices, debonding the first carrier substrate, attaching the encapsulant and the semiconductor devices to a second carrier substrate, forming a first redistribution structure on the encapsulant, the interposer structure, and the integrated passive devices, wherein the first redistribution structure contacts the interposer structure and the integrated passive devices, and forming external connectors on the first redistribution structure. In an embodiment, the method further includes forming a second redistribution structure on the interposer structure, wherein the second redistribution structure is attached to the first carrier substrate. In an embodiment, the method further includes forming an interconnect structure on the interposer structure, wherein the semiconductor devices are attached to the interconnect structure. In an embodiment, the method further includes forming an encapsulant over the semiconductor devices before attaching the interposer structure to the first carrier substrate. In an embodiment, the method further includes forming conductive connectors on the first carrier substrate, wherein the integrated passive devices are attached to the first carrier substrate. In an embodiment, attaching the interposer structure to a first carrier substrate includes forming an adhesive on the interposer structure and attaching the interposer structure to the first carrier substrate using the adhesive. In an embodiment, the integrated passive devices are separated from the interposer structure by the encapsulant.

In an embodiment, a package includes a device substrate and a device structure attached to the first side of the device substrate, the device structure including a first interposer, a second interposer, first semiconductor devices attached to the first interposer, second semiconductor devices attached to the second interposer, and a first redistribution structure connected to the first interposer and the second interposer. In an embodiment, the device substrate includes integrated circuits. In an embodiment, the device substrate is a second redistribution structure. In an embodiment, the device structure further includes a surface-mount device (SMD) attached to a first side of the device substrate. In an embodiment, the package further includes an encapsulant material covering the SMD and surrounding the device structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a device structure, comprising:
      connecting a first die to a first interposer;
      connecting a second die to a second interposer; and
      forming a first redistribution structure over the first interposer and the second interposer, wherein the first redistribution structure electrically connects the first interposer to the second interposer; and
   forming a package structure, comprising:
      attaching a first surface mounted device (SMD) and the device structure to a first carrier;
      encapsulating the first SMD and the device structure with a first encapsulant to form an encapsulated structure having a top surface and a bottom surface;
      attaching the top surface of the encapsulated structure to a second carrier; and
      forming a second redistribution structure over the bottom surface of the encapsulated structure, wherein the second redistribution structure electrically connects the first SMD and the device structure.

2. The method of claim 1, wherein forming the package structure further comprises attaching a second SMD to the first carrier, wherein the second SMD has a different thickness than the first SMD.

3. The method of claim 1, further comprising planarizing the encapsulated structure, wherein after planarizing the encapsulated structure, a top surface of the first die and a top surface of the first encapsulant are level.

4. The method of claim 1, wherein forming the device structure further comprises encapsulating the first interposer and the second interposer with a second encapsulant, wherein the first redistribution structure extends over the second encapsulant.

5. The method of claim 1, wherein a thickness of the first SMD is less than a thickness of the encapsulated structure.

6. The method of claim 1, further comprising, after connecting the first die to the first interposer, electrically testing the first die before forming a first redistribution structure over the first interposer.

7. The method of claim 1, wherein sidewalls of the second redistribution structure are coplanar with sidewalls of the encapsulated structure.

8. The method of claim 1, further comprising forming external connectors on the second redistribution structure.

9. A method comprising:
   attaching a plurality of semiconductor devices to an interposer structure;
   attaching the interposer structure to a first carrier substrate;
   attaching a plurality of integrated passive devices to the first carrier substrate;
   forming an encapsulant over the plurality of semiconductor devices and the plurality of integrated passive devices;
   debonding the first carrier substrate;
   attaching the encapsulant and the plurality of semiconductor devices to a second carrier substrate;
   forming a first redistribution structure on the encapsulant, the interposer structure, and the plurality of integrated passive devices, wherein the first redistribution structure contacts the interposer structure and the plurality of integrated passive devices; and
   forming a plurality of external connectors on the first redistribution structure.

10. The method of claim 9, further comprising forming a second redistribution structure on the interposer structure, wherein the second redistribution structure is attached to the first carrier substrate.

11. The method of claim 9, further comprising forming an interconnect structure on the interposer structure, wherein the plurality of semiconductor devices are attached to the interconnect structure.

12. The method of claim 9, further comprising forming an encapsulant over the plurality of semiconductor devices before attaching the interposer structure to the first carrier substrate.

13. The method of claim 9, further comprising forming conductive connectors on the first carrier substrate, wherein the plurality of integrated passive devices are attached to the first carrier substrate.

14. The method of claim 9, wherein attaching the interposer structure to the first carrier substrate comprises forming an adhesive on the interposer structure and attaching the interposer structure to the first carrier substrate using the adhesive.

15. The method of claim 9, wherein the plurality of integrated passive devices are separated from the interposer structure by the encapsulant.

16. A method comprising:
   forming a device structure, comprising:
      forming a first interposer on a first substrate;
      attaching a plurality of first semiconductor devices to a first side of the first interposer;
      forming a second interposer on a second substrate, wherein the second substrate is different than the first substrate;
      attaching a plurality of second semiconductor devices to a first side of the second interposer; and
      forming a first redistribution structure on a second side of the first interposer and on a second side of the second interposer, wherein the first redistribution structure interconnects the first interposer and the second interposer; and
   attaching the first redistribution structure of the device structure to a first side of a device substrate.

17. The method of claim 16, wherein the device substrate comprises integrated circuits.

18. The method of claim 16, wherein the device substrate is a second redistribution structure.

19. The method of claim 16, further comprising attaching a surface-mount device (SMD) to the first side of the device substrate.

20. The method of claim 19, further comprising forming an encapsulant material covering the SMD and surrounding the device structure.

* * * * *